US012787380B2

(12) United States Patent
Van Dal

(10) Patent No.: US 12,787,380 B2
(45) Date of Patent: Nov. 3, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventor: Marcus Johannes Henricus Van Dal, Linden (BE)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 780 days.

(21) Appl. No.: 18/097,343

(22) Filed: Jan. 16, 2023

(65) Prior Publication Data

US 2024/0222429 A1 Jul. 4, 2024

Related U.S. Application Data

(60) Provisional application No. 63/435,749, filed on Dec. 28, 2022.

(51) Int. Cl.

| | |
|---|---|
| ***H10D 62/10*** | (2025.01) |
| ***H10D 30/67*** | (2025.01) |
| ***H10D 64/01*** | (2025.01) |
| ***H10D 84/01*** | (2026.01) |
| ***H10D 84/03*** | (2025.01) |

(52) U.S. Cl.

CPC ....... *H10D 62/121* (2025.01); *H10D 30/6735* (2025.01); *H10D 30/6757* (2025.01); *H10D 64/018* (2025.01); *H10D 84/0167* (2025.01); *H10D 84/017* (2025.01); *H10D 84/038* (2025.01)

(58) Field of Classification Search

CPC ........... H10D 30/6735; H10D 30/6757; H10D 64/018; H10D 84/0167; H10D 84/017; H10D 84/038

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |

(Continued)

*Primary Examiner* — Jeff W Natalini
*Assistant Examiner* — Rose Keagy
(74) *Attorney, Agent, or Firm* — NZ Carr Law Office

(57) ABSTRACT

A method of forming a semiconductor structure is provided. A complementary FET (CFET) device including a first FET device and a second FET device isolated with each other by a middle dielectric layer is formed. The first and second FET devices are stacked over each other in a vertical direction. A first inner spacer is formed immediately below and above a peripheral portion of each of a plurality of first nanosheet channels of the first FET device. A second inner spacer is formed immediately below and above a peripheral portion of each of a plurality of second nanosheet channels of the second FET device. The first inner spacers and the second inner spacers are formed at different process steps.

20 Claims, 51 Drawing Sheets

(56) References Cited

U.S. PATENT DOCUMENTS

| | | | | |
|---|---|---|---|---|
| 9,608,116 | B2 | 3/2017 | Ching et al. | |
| 2021/0210349 | A1* | 7/2021 | Xie | H10D 84/0151 |
| 2021/0265345 | A1* | 8/2021 | Xie | H10D 62/116 |
| 2021/0265348 | A1* | 8/2021 | Xie | H10D 88/01 |
| 2021/0296184 | A1* | 9/2021 | Xie | H10D 30/014 |
| 2023/0178435 | A1* | 6/2023 | Huang | H10D 30/43<br>257/351 |
| 2023/0420544 | A1* | 12/2023 | Mertens | H10D 84/0186 |

* cited by examiner

SEMICONDUCTOR DEVICE STRUCTURE AND METHODS OF FORMING THE SAME

CROSS-REFERENCE TO RELATED APPLICATIONS

This application claims priority to U.S. Provisional Application Ser. No. 63/435,749 filed Dec. 28, 2022, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In pursuit of higher device density, higher performance, and lower costs, challenges from both fabrication and design issues have resulted in the development of three-dimensional designs, such as a multi-gate field effect transistor (FET), including a nanosheet FET. In a nanosheet FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down, further improvements of the nanosheet FET are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
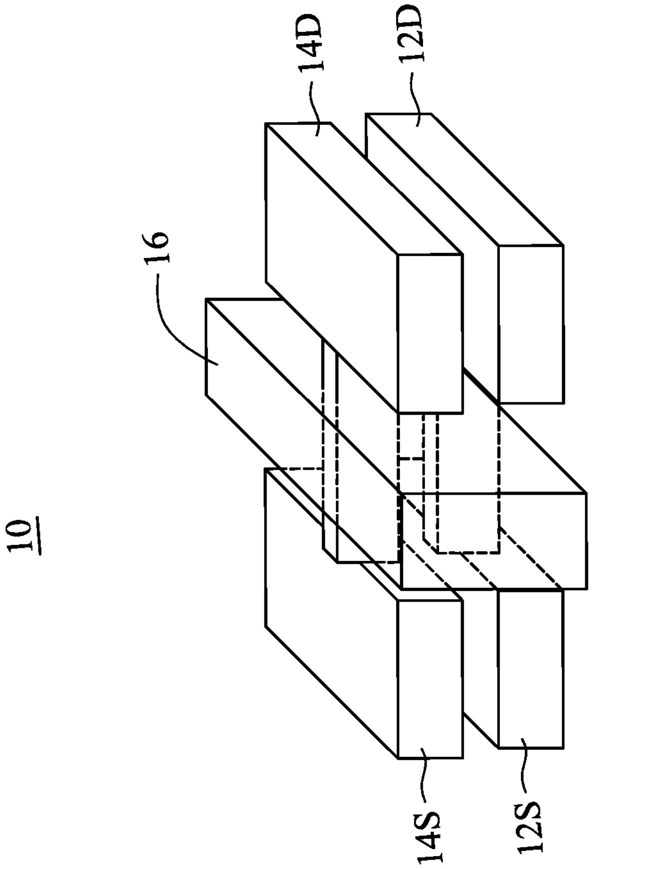
FIG. 1 is a perspective view of an exemplary Complimentary FET (CFET) device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To further extend the scalability of the nanosheet architecture and to push standard logic cells towards ≤5T track height design, that is, 5 intracell metal lines fit in the range of the standard cell height, complementary FET (CFET) has been developed. The CFET can lead to a chip area scaling up to 50% with respect to an equivalent FinFET or Nanosheet technology where NFET and PFET are arranged side by side at the same level. As shown in FIG. 1, a CFET 10 may include an NMOS (NFET) device and a PMOS (PFET) device stacked on top of each other at different levels. The PMOS includes a source 12S and a drain 12D, the NMOS includes a source 14S and a drain 14D, and the PMOS and the NMOS share a common gate 16. The CFET may be manufactured in many different integration routes. One approach is the monolithic approach where the devices are fabricated from a single wafer substrate. The other approach is the sequential approach where a wafer is transferred from a donor wafer at some stage in the process flow. As devices are formed on different wafers and then combined with each other subsequently, use of more templates are inevitable; and thus, the sequential approach is more costly compared to the monolithic approach. In addition, as the device is formed on the donor wafer and then transferred to the accepting wafer, alignment between the device on the donor wafer and the device in the accepting wafer may be an issued during wafer transfer.

In the monolithic approach, as the PMOS and the NMOS are stacked on top of each other, a high aspect ratio can be expected. For example, as shown in FIG. 2(A), a first stack 22 of alternately formed first semiconductor layers 22A and second semiconductor layers 22B is formed on a substrate 20. A middle dielectric isolation layer (MDI) 23 is formed on the first stack 22 of first and second semiconductor layers 22A and 22B. A second stack 24 of alternately formed first semiconductor layers 24A and 24B is formed on the MDI layer 23. In one embodiment, the order of the first semiconductor layers 22A and the second semiconductor layers 22B in the first stack 22 is opposite to the order of the first semiconductor layers 24A and the semiconductor 24B in the second stack 24 like a mirror image at two sides of the MDI layer 23. A gate 26, including a gate electrode layer 26A, a gate dielectric layer 26B, and a gate spacer 26C, is formed and patterned on the second stack 24. After the gate 26 is formed, an etch process is performed to remove peripheral portions of the first semiconductor layers 22A and 24A to form recesses 27 above and below the periphery of each of the second semiconductor layers 22B and 24B as shown in FIG. 2(B). In FIG. 2(C), each of the recesses is filled with an inner spacer 28.

Figure 2:
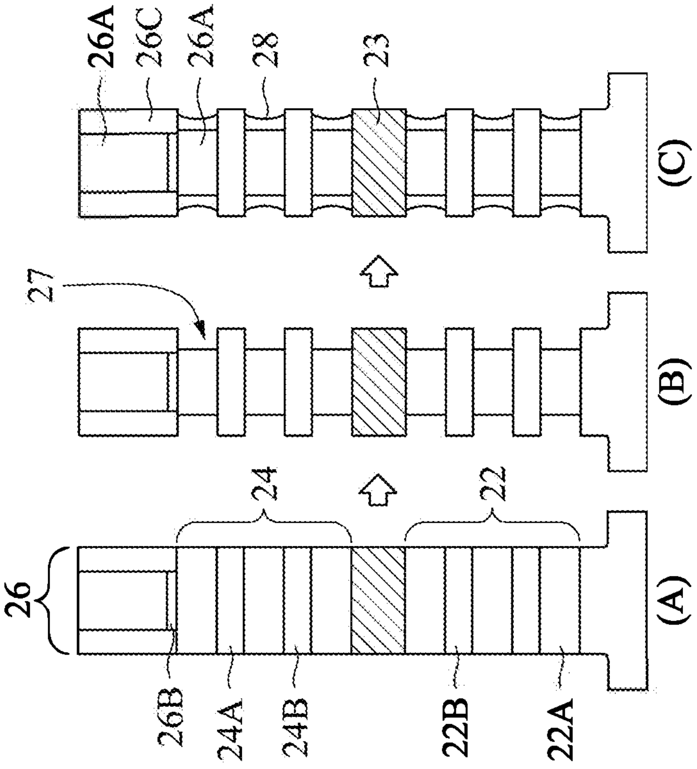
FIG. 2 illustrates cross-sectional side views of three stages of manufacturing a CEFT device as shown in FIG. 1.

In the embodiment as shown in FIG. 2, the inner spacers 28 for both the PMOS and the PMOS are formed together in the same process. As the gate pitches are smaller and smaller, for example, smaller than 50 nm, the formation of the inner spacers 28 become very difficult to control. To improve control of the formation of the inner spacers, a dual inner spacer module for monolithic CFET with which the cavity recess of the sacrificial layer required for formation of inner spacer is tunable independently for the top device and the bottom device is proposed. This allows the effective gate length of the top and bottom devices to be tunned independently. A detailed description of the dual inner spacer module for monolithic CFET will be described in detail herein with.

Figure 3A:
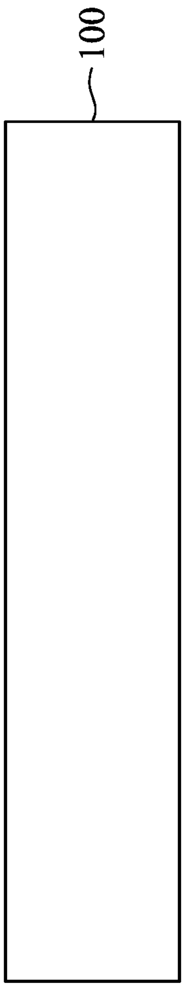
FIGS. 3A and 3B are a cross-sectional view and a perspective view of a substrate provided for forming a CFET device, respectively, in accordance with some embodiments.
Figure 3B:
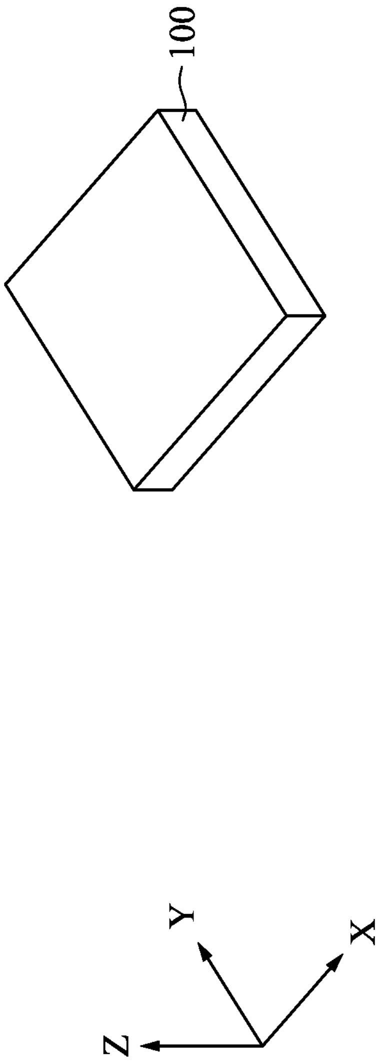

FIGS. 3A and 3B shows a cross-sectional view and a perspective view of a substrate 30 from which CFET devices may be formed. In one embodiment, a monolithic CFET process is performed to form a CFET with a top FET device and a bottom FET device, each FET device may include gate-all-around nanosheets. The cross section of the substrate 30 may extend along the x-z plane in the embodiment as shown in FIG. 3A. In the following description and drawings, the figures referenced with the letter "A" after the numeral reference illustrates the cross section extending along the x-z plane, while the figure referenced with the letter "B" after the numeral reference illustrates the perspective (3D) view of the device.

According to one embodiment, the substrate 100 may be a semiconductor substrate. In some embodiments, the substrate 100 includes a single crystalline semiconductor layer on at least the surface of the substrate 100. The substrate 100 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 100 is made of Si. In some embodiments, the substrate 100 is a silicon-on-insulator (SOI) substrate, which includes an insulating layer (not shown) disposed between two silicon layers. In one aspect, the insulating layer is an oxide.

One or more buffer layers (not shown) may be formed on the surface of the substrate 100. The buffer layers can serve to gradually change the lattice constant from that of the substrate to that of the source/drain (S/D) regions to be grown on the substrate 100. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, and InP. In one embodiment, the substrate 101 includes SiGe buffer layers epitaxially grown on the silicon substrate 100. The germanium concentration of the SiGe buffer layers may increase from 30 atomic percent germanium for the bottom-most buffer layer to 70 atomic percent germanium for the top-most buffer layer. The substrate 100 may include various regions that have been suitably doped with impurities (e.g., p-type or n-type impurities). The dopants are, for example boron for a p-type field effect transistor FET (PFET) and phosphorus for an n-type FET (NFET).

Figure 4:
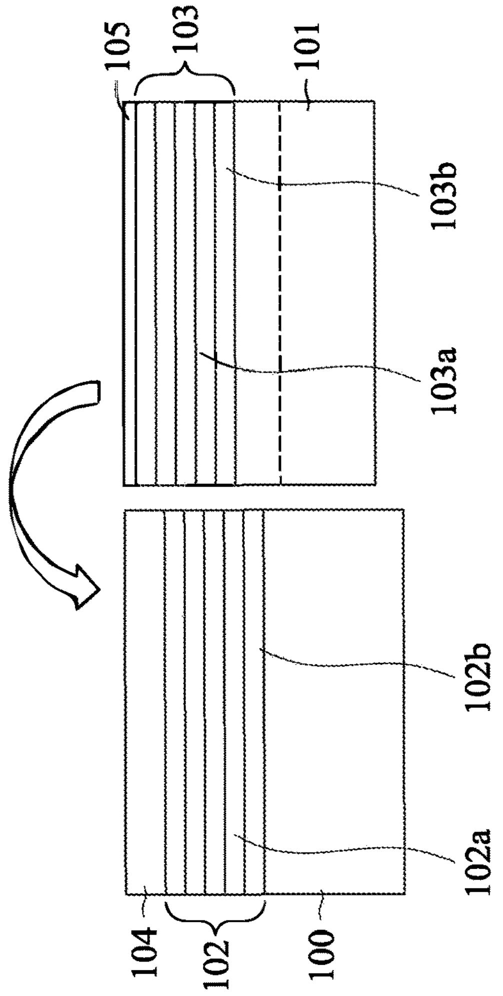
FIGS. 4-7 show the preparation of stacked nanosheets epitaxial stacks isolated with each other by a middle dielectric isolation layer for forming a CFET according to some embodiments.

In FIG. 4, a stack of semiconductor layers 102 including alternately formed first semiconductor layers 102*a* and second semiconductor layers 102*b* is formed on the substrate 100. The first semiconductor layers 102*a* and the second semiconductor layers 102*b* are made of semiconductor materials having different etch selectivity and/or oxidation rates. For example, the first semiconductor layers 102*a* may be made of Si and the second semiconductor layers 102*b* may be made of SiGe. In some examples, the first semiconductor layers 102*a* may be made of SiGe and the second semiconductor layers 102*b* may be made of Si. Alternatively, in some embodiments, either of the semiconductor layers 102*a* and 102*b* may be or include other materials such as Ge, SiC, GeAs, GaP, InP, InAs, InSb, GaAsP, AlInAs, AlGaAs, InGaAs, GaInP, GaInAsP, or any combinations thereof. In the embodiment as shown in FIG. 4, the first semiconductor layers 102*a* are made of Si and the second semiconductor layers 102*b* is made of $Si_{1-x}$ $Ge_x$ with x ranging between about 25% and about 50%.

The first semiconductor layers 102*a* or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

The first and second semiconductor layers 102*a* and 102*b* may be formed by any suitable deposition process, such as epitaxy. For example, epitaxial growth of the layers of the stack of semiconductor layers 102 may be performed by a molecular beam epitaxy (MBE) process, a metalorganic chemical vapor deposition (MOCVD) process, and/or other suitable epitaxial growth processes. After forming the stack of semiconductor layers 102, a dielectric layer 104 is formed. The dielectric layer 104 may include an oxide layer such as $SiO_2$ using oxidation process such thermal oxidation process.

Figure 5:
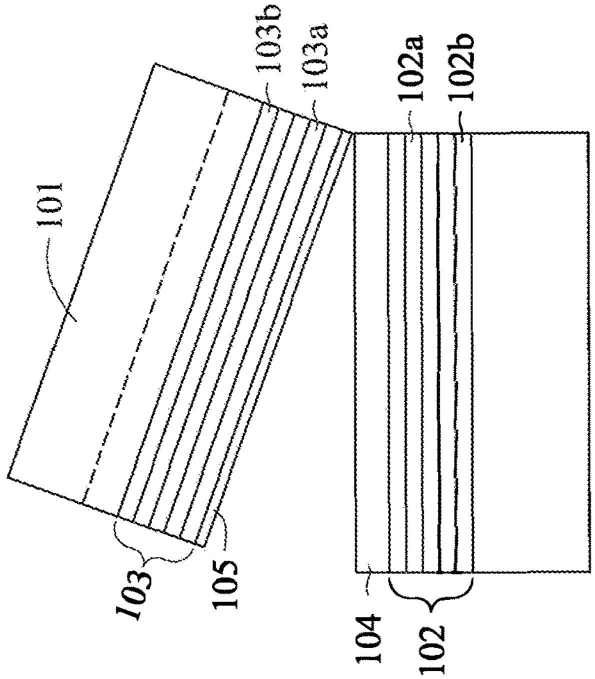
Figure 6:
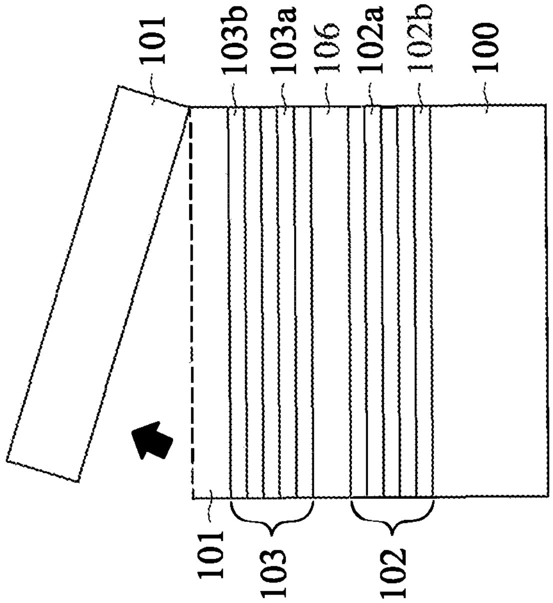

Further referring to FIG. 4, on another substrate 101, a stack of semiconductor layers 103 is formed. The stack of semiconductor layers 103 may include alternatively formed semiconductor layers 103*a* and 103*b*, for example. A dielectric layer 105 is formed on the stack of semiconductor layers 103. The substrate 101, the stack of semiconductor layers 103, and the dielectric layer 105 may be formed using the same or similar materials and processes used for forming the substrate 100, the stack of semiconductor layers 102, and the dielectric layer 104, respectively. In one embodiment, the substrate 101, the stack of semiconductor layers 103, and the dielectric layer 105 serve as a donor wafer transferred on the dielectric layer 104 by wafer transfer process as shown in FIG. 5. In FIG. 6, the donor wafer has been transferred with the dielectric layer 105 bonded with the dielectric layer 104 as a middle dielectric isolation (MDI) layer 106. A smart-cut process is then performed to remove a top portion of the substrate 101. The remaining portion of the substrate 101 is removed by, for example, polishing or other suitable processes until the second semiconductor layer 103*b* of the stack of semiconductor layers 103 is exposed. The combined wafers may be subject to an optional low temperature annealing process, for example, a curing process with a temperature lower than 500° C.

Figure 7:
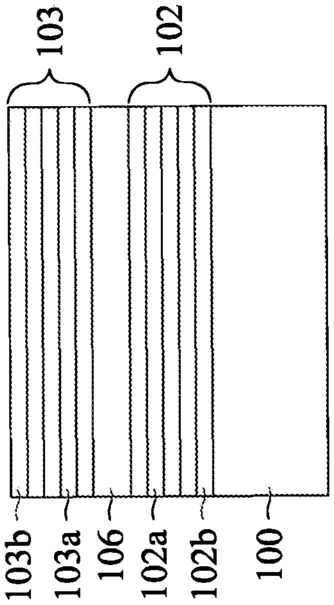

In some embodiments, a complementary FET (CFET) in which two or more nanosheet FETs are vertically stacked on top of one another will be formed from the semiconductor structure as shown in FIG. 7. In such a case, the first semiconductor layers 102*a* and 103*a* may include channels for the two or more nanosheet FETs. In the embodiment shown in FIG. 4, for example, the first semiconductor layers 103*a* may define the channels of a first FET, such as an NFET, and the semiconductor layers 102*a* may define the channels of a second FET, such as a PFET. The thickness of the first semiconductor layers 102*a* and 103*a* is chosen based on device performance considerations. In some embodiments, each first semiconductor layer 102*a* and 103*a* has a thickness ranging from about 3 nanometers (nm) to about 10 nm. The second semiconductor layers 102*b* and 103*b* may eventually be removed and serve to define spaces for a gate stack to be formed therein. Likewise, each of the second semiconductor layers 102*b* and 103*b* may have a thickness that is equal, less, or greater than the thickness of the first semiconductor layers 102*a* and 103*a*, depending on device performance considerations. In one aspect, each second semiconductor layers 102*b* and 103*b* has a thickness that is equal to the thickness of the semiconductor layers 102*a* and 103*a*.

In some embodiments, the MDI layer 106 may include silicon oxide $SiO_2$ formed by thermal oxidation or suitable deposition processes. As epitaxial growth does not occur on $SiO_2$, the MDI layer 106 disposed between the semiconductor second layer 103*b* in the top FET (e.g., n-channel FET) and the semiconductor layer 102*b* in the bottom FET (e.g., p-channel FET) provides significant isolation effect. That is, the operations of either the top or bottom FET will not interfere with the operation of the other FET. The MDI layer 106 may have a thickness larger than the thickness of the second semiconductor layers 102*b* and 103*b* to help define boundary of the first FET and the second FET at a later stage. In such cases, the thickness of the MDI layer 106 may be about 1.5 to about 3 times thicker than the second semiconductor layer 102*b* or the second semiconductor layer 103*b*.

In the embodiment as shown in FIG. 7, the stack of semiconductor layers 102 includes three of the second semiconductor layers 102_b_ and two of the first semiconductor layers 102_a_, while the stack of semiconductor layers 103 includes three of the first semiconductor layers 103_b_ and two of the first semiconductor layers 103_a_. It is appreciated that the numbers of the first and second semiconductor layers 102_a_ and 102_b_ in the stack 102 and the numbers of first and second semiconductor layers 103_a_ and 103_b_ in the stack 103 may vary depending on the predetermined number of nanosheet channels needed for the corresponding FET of the CFET semiconductor device structure.

Figure 8B:
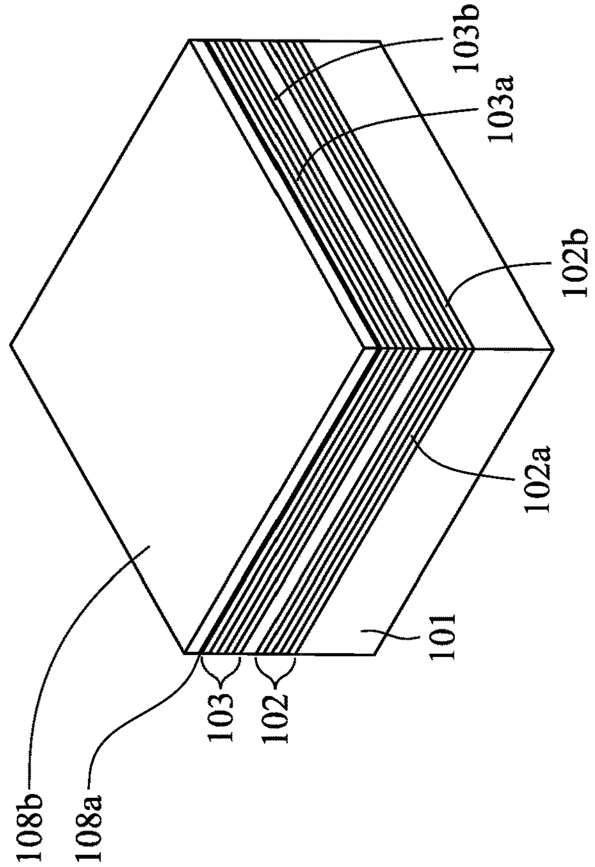
FIGS. 8A and 8B are a cross-sectional view and a perspective view of a stage of manufacturing a CFET device structure, respectively, in accordance with some embodiments.
Figure 8A:
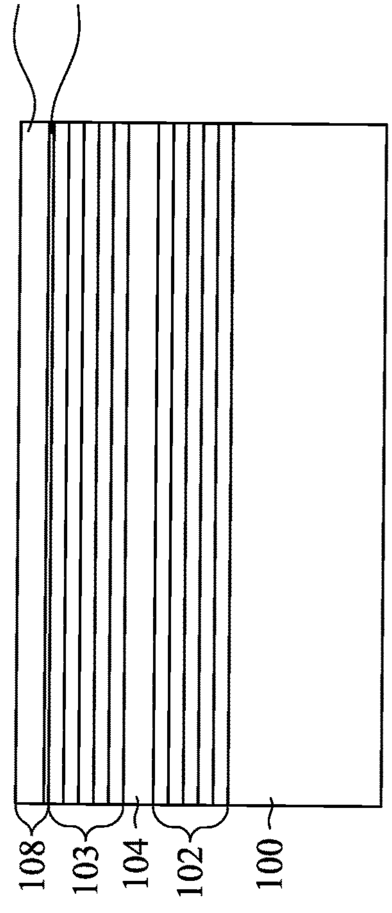

FIGS. 8A and 8B are a cross-sectional view and a perspective view of one of the various stages of manufacturing the CFET semiconductor device in accordance with some embodiments. As shown in FIGS. 8A and 8B, a mask structure 108 is formed on the stack of semiconductor layers 103. The mask structure 108 may include an oxygen-containing layer 108_a_ and a nitrogen-containing layer 108_b_. The oxygen-containing layer 108_a_ may be a pad oxide layer, such as a $SiO_2$ layer. The nitrogen-containing layer 108_b_ may be a pad nitride layer, such as $Si_3N_4$. The mask structure 108 may be formed by any suitable deposition process, such as chemical vapor deposition (CVD) process or plasma enhance atomic layer deposition (PEALD).

Figure 9A:
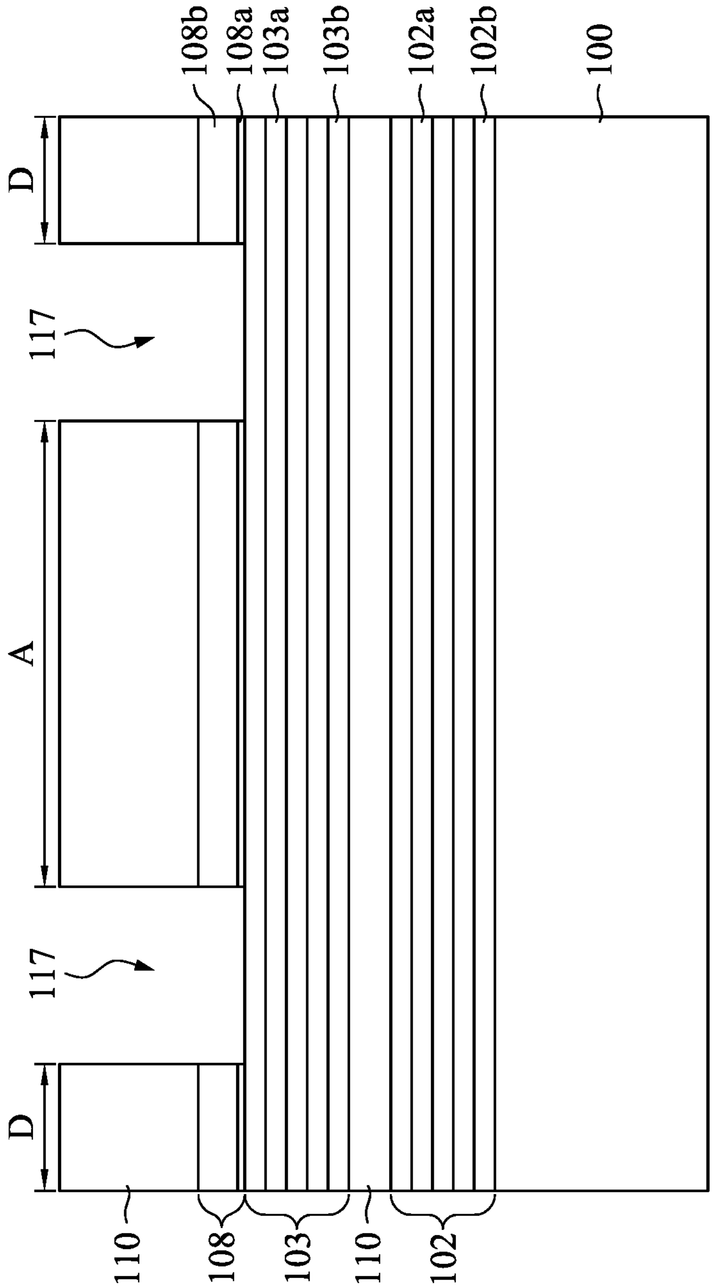
FIGS. 9A and 9B are a cross-sectional view and a perspective view of a stage of manufacturing a CFET device structure, respectively, in accordance with some embodiments.
Figure 9B:
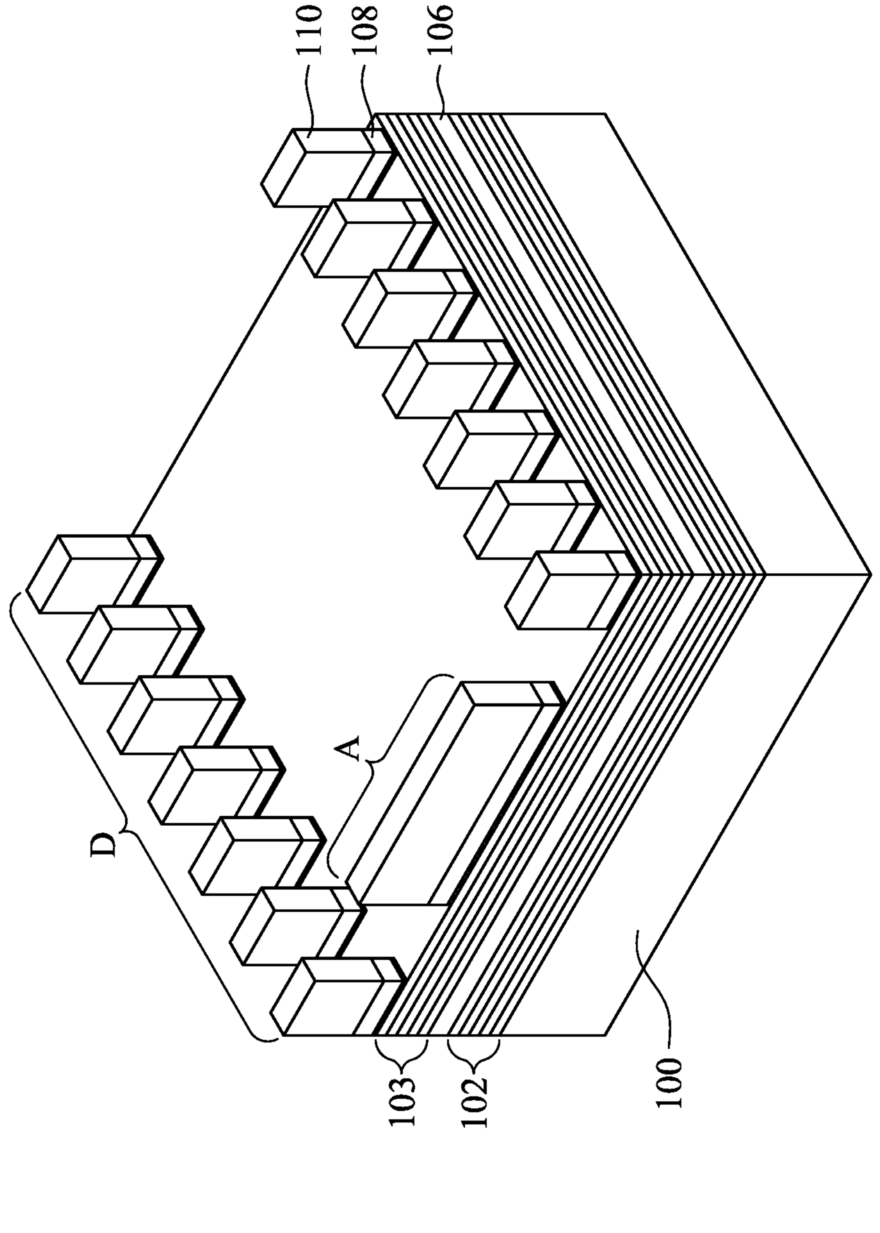

FIGS. 9A and 9B are a cross-sectional view and a perspective view of one of the various stages of manufacturing the CFET semiconductor device in accordance with some embodiments. In FIGS. 9A and 9B, photolithography process is performed to define an actual device region "A" where the CFET device and will be formed in the subsequent processes and dummy fin regions "D." For example, a photoresist layer 110, for example, an oxide layer, is formed on the mask structure 108. The photoresist layer 110 and the mask structure 108, including the oxide layer 108_a_ and the nitride layer 108_b_, are patterned to expose the underlying second semiconductor layers 103_b_ of the stack of semiconductor layers 103. The photoresist layer 110 may be formed by plasma enhance chemical vapor deposition (PECVD), for example. In the embodiment FIG. 9B, the photoresist layer 110 and the mask structure 108 are patterned into one actual device region "A" and two rows of dummy fin regions "D" at two opposite sides of the actual device region "A" as shown in FIG. 9B. It is appreciated that the number of the actual device region "A" is not limited to only one, and the rows of dummy fin regions "D" are not limited to two. Instead, according to the specific device requirements, multiple actual device regions "A" may be defined in a row, or multiple rows alternately arranged with multiple rows of dummy fin regions "D."

Figure 10A:
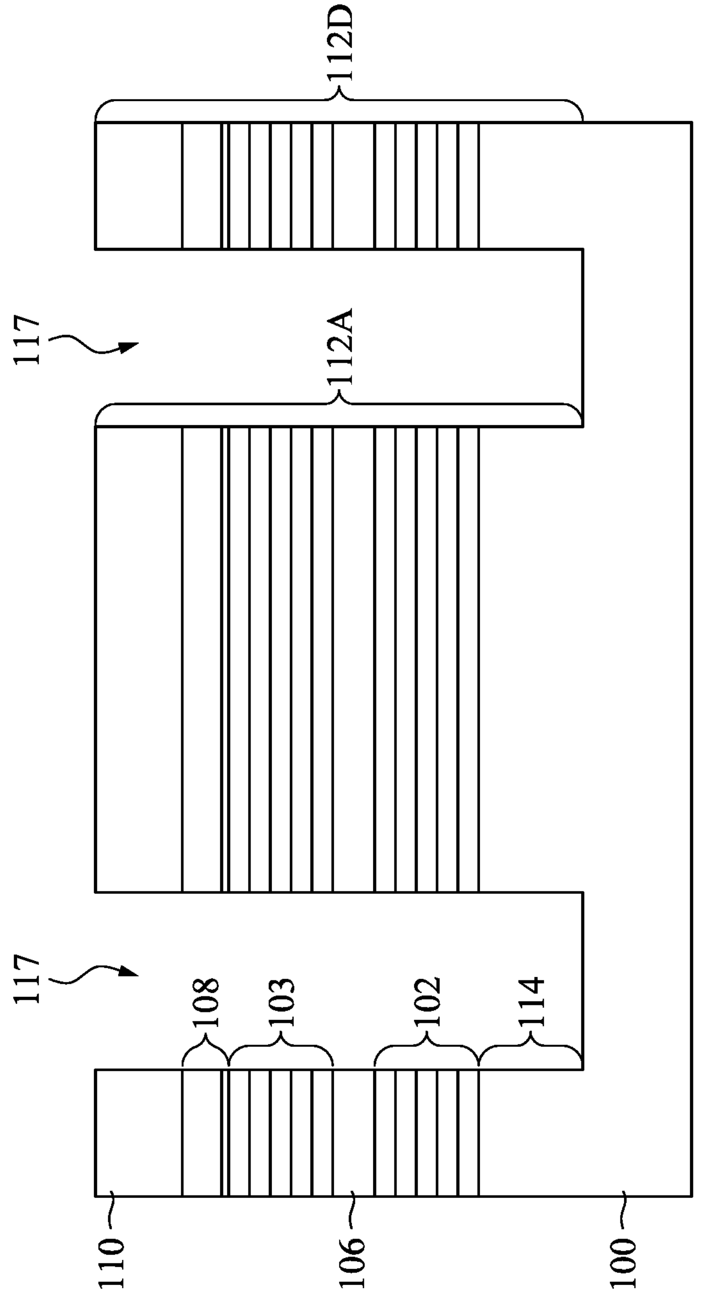
FIGS. 10A and 10B are a cross-sectional view and a perspective view of a stage of manufacturing a CFET device structure, respectively, in accordance with some embodiments.
Figure 10B:
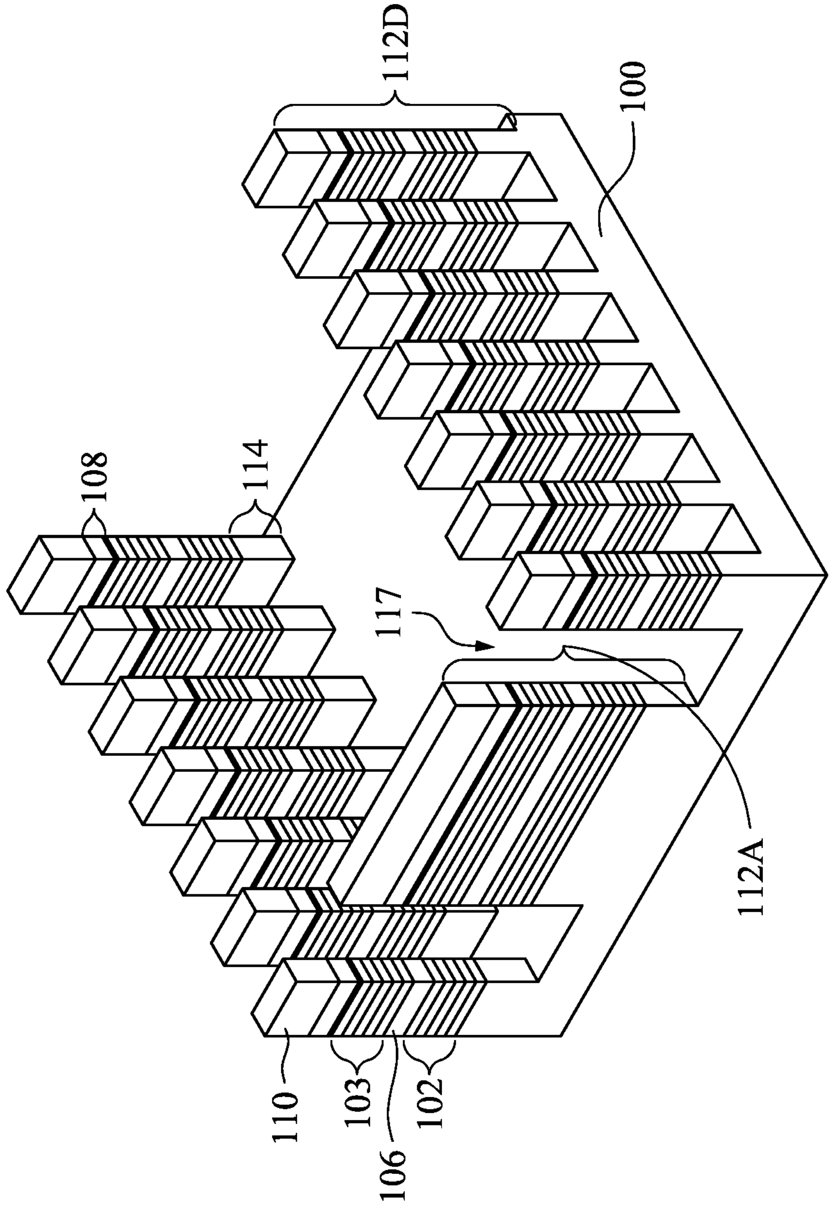

The exposed stack of semiconductor layers 103 and the portions of the underlying MDI layer 104, stack of semiconductor layers 102, and the substrate 100 are etched to form two trenches 117 using the photoresist layer 110 and mask structure 108 as a mask. As shown in FIGS. 10A and 10B, an actual device fin structure 112A and two rows of dummy fin structures 112D are formed and separated from each other by the respective trenches 117. Each of the dummy fin structures 112D and the actual device fin structure 112A has an upper portion, including the stacks of semiconductor layers 102 and 103 isolated with each other by the MDI layer 106 and a lower portion, that is, a well portion 114, formed from the substrate 101. Although FIGS. 10A and 10B shows only one actual device fin structure 112A for forming one CFET, it is appreciated that more than one actual device region A may be defined one the substrate 100, and multiple actual device fin structures 112A may be formed between each pair of the dummy fin structures 112D on the substrate 100. In some embodiments, process for patterning the photoresist layer 110 to form the patterned photoresist may be performed using an electron beam (e-beam) lithography process. The trenches 117 may be etched using a dry etch, for example, RIE, a wet etch, and/or combination thereof.

Figure 11A:
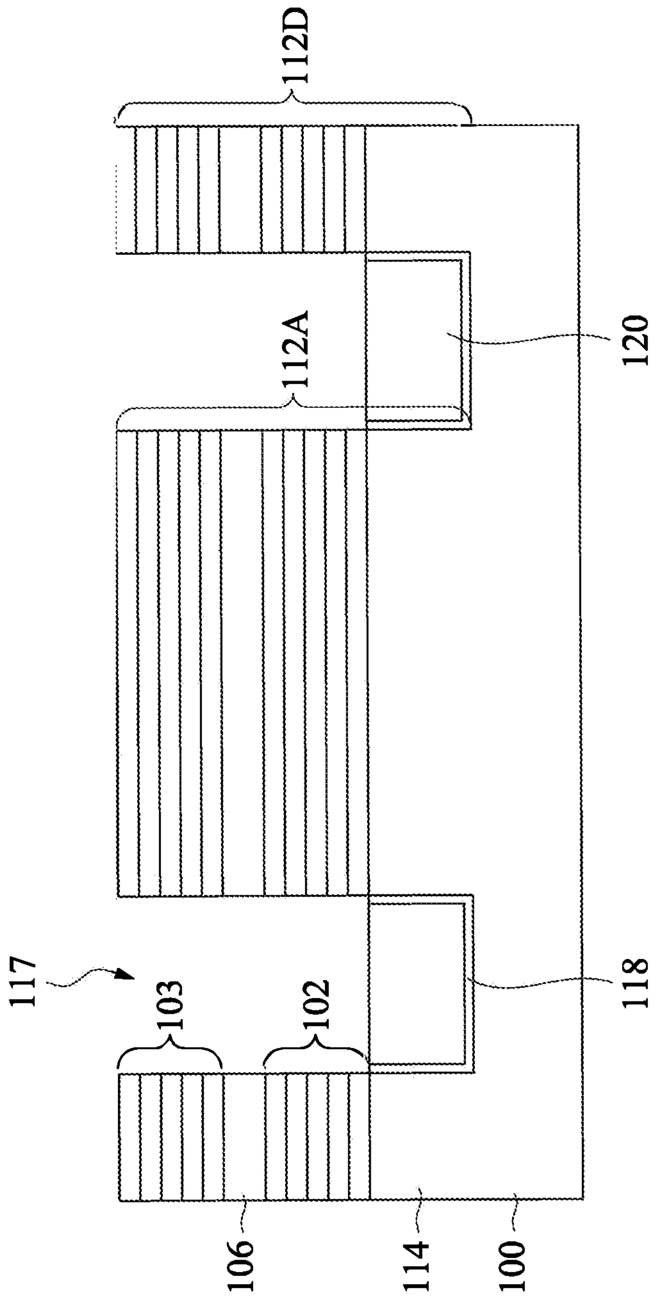
FIGS. 11A and 11B are a cross-sectional view and a perspective view of a stage of manufacturing a CFET device structure, respectively, in accordance with some embodiments.
Figure 11B:
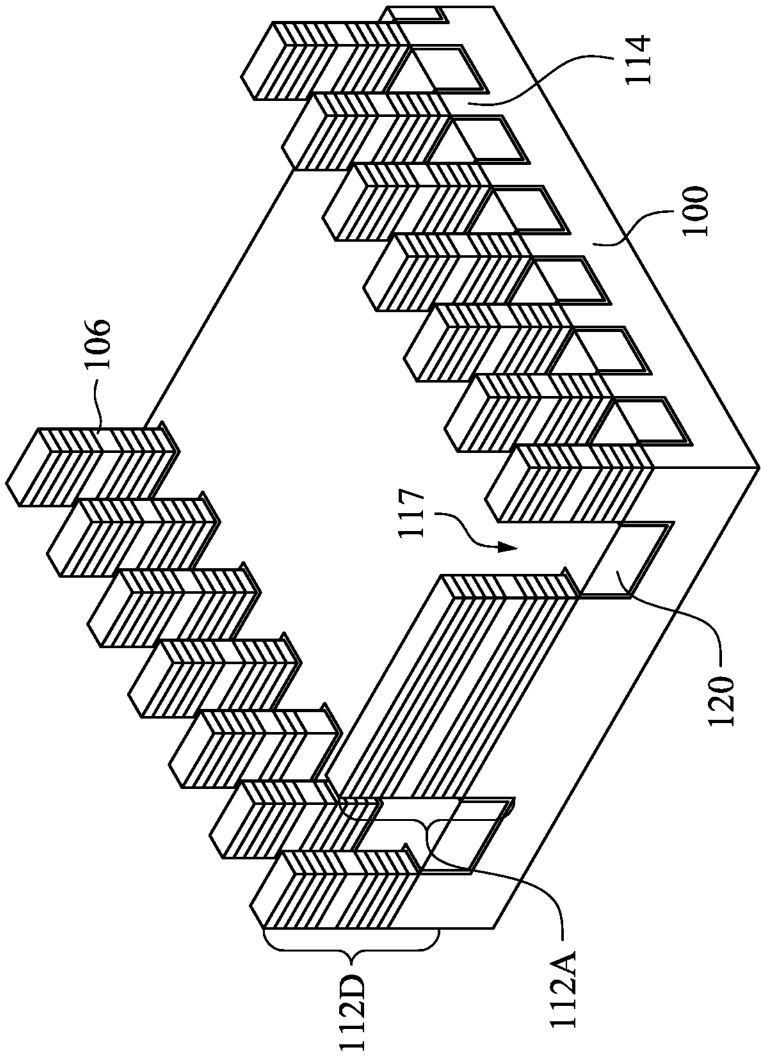

In FIGS. 11A and 11B, a liner layer 118 is formed over the substrate 100. The liner layer 118 may be a conformal layer formed by any suitable process, such as an atomic layer deposition (ALD) process. The term "conformal" may be used herein for ease of description upon a layer having substantial same thickness over various regions. The liner layer 118 may be made of silicon nitride, silicon oxynitride (SiON), SiOCN, SiCN, fluorine-doped silicate glass (FSG), a low-K dielectric material, or any suitable dielectric material.

After formation of the liner layer 118, an insulating material 120 is formed on the liner layer 118. Then, the insulating material 120 and the liner layer 118 are recessed, so the insulating material 120 fills the portions of the trenches 117, for example, fills the portions between the neighboring well portions 114 of the corresponding fin structures 112A and 112D. In the embodiment as shown in FIGS. 11A and 11B, the insulation material 120 may be formed by suitable processes such as thermal oxidation to serve as shallow trench isolation (STI) with a top surface levelled with the top surface of the well portions 114. The mask structure 108 and the oxide layer 110 are then removed to expose the stack of semiconductor layers 103.

Figure 12A:
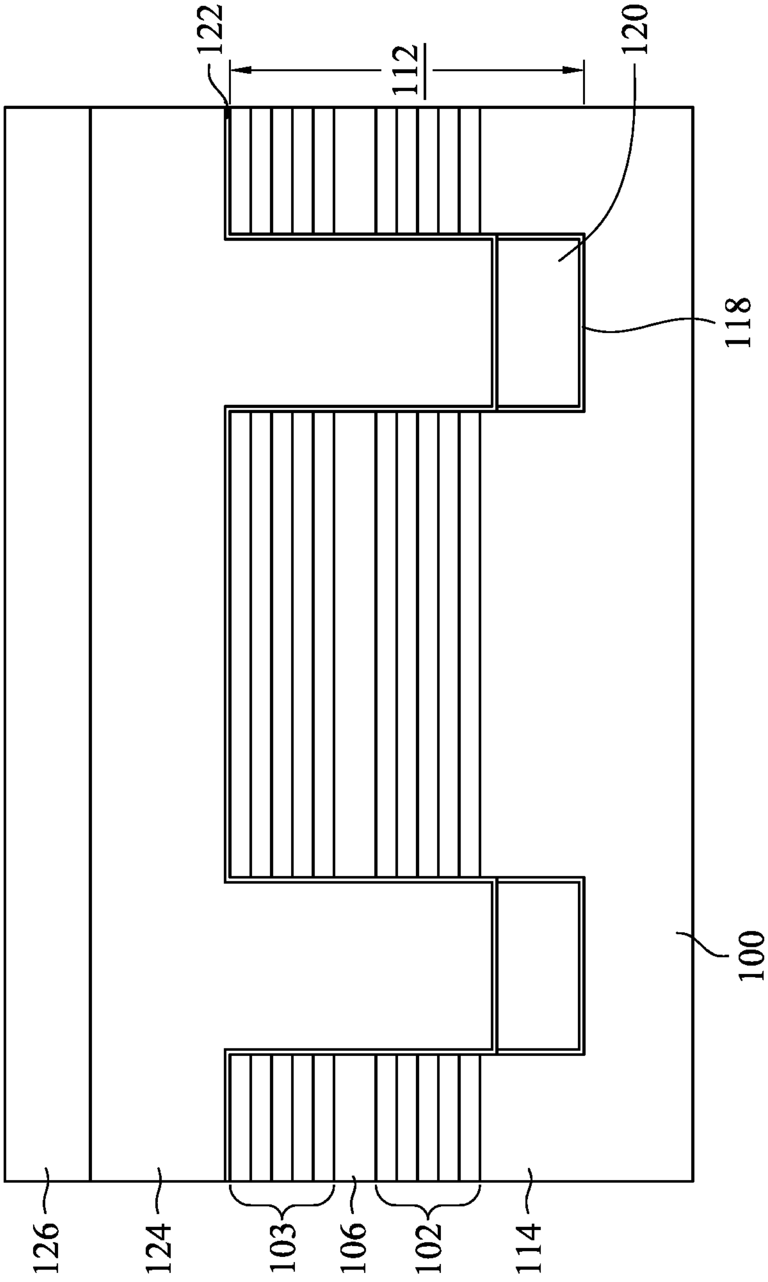
FIGS. 12A and 12B are a cross-sectional view and a perspective view of a stage of manufacturing a CFET device structure, respectively, in accordance with some embodiments.
Figure 12B:
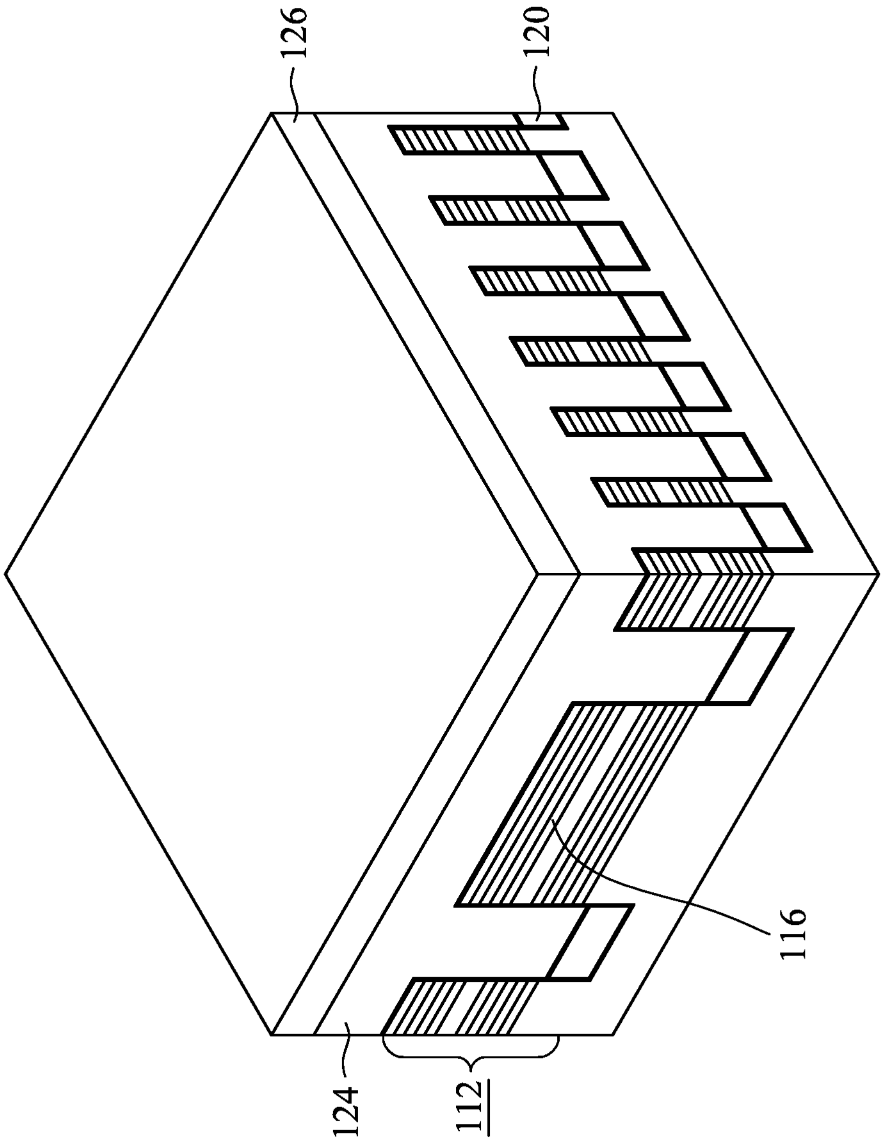

In FIGS. 12A and 12B, a conformal sacrificial dielectric layer 122 is formed over the actual device fin structure 112A, the dummy fin structures 112D, and the STI 120. The sacrificial dielectric layer 122 may include an oxide layer formed by flowable deposition or other suitable processes. A dummy gate layer 124 (or a sacrificial gate electrode layer) is formed over the sacrificial dielectric layer 122 and filling the trenches 117. The dummy gate layer 124 may be an amorphous silicon or polysilicon layer deposited by CVD, LPCVD, PECVD, PVD, ALD, sputter deposition, or other suitable deposition processes. A hard mask layer 126 is then formed over the dummy gate layer 124. The hard mask layer 126 may be a nitrogen containing layer such as $Si_3N_4$ formed by, for example, PEALD.

Figure 13A:
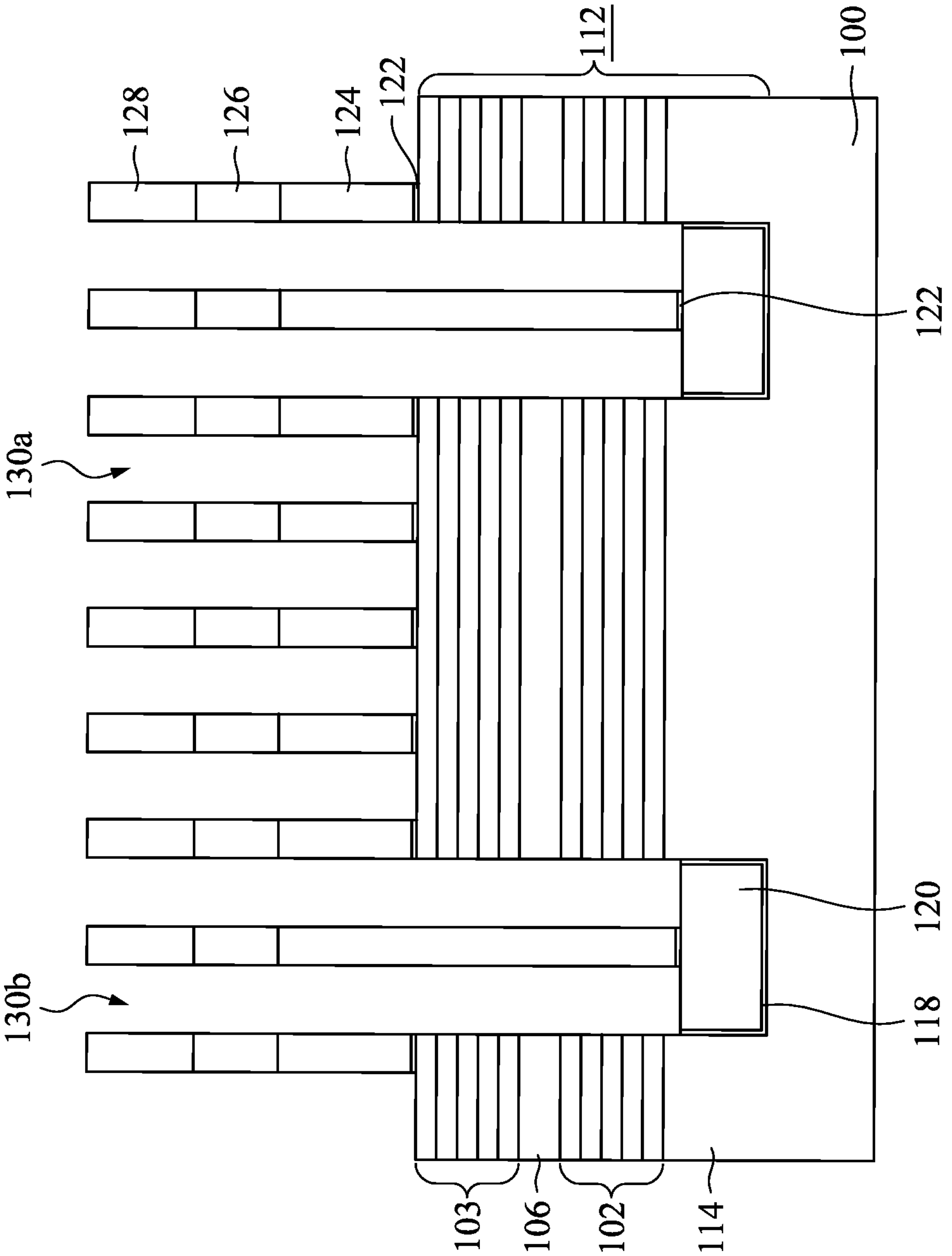
FIGS. 13A and 13B are a cross-sectional view and a perspective view of a stage of manufacturing a CFET device structure, respectively, in accordance with some embodiments.
Figure 13B:
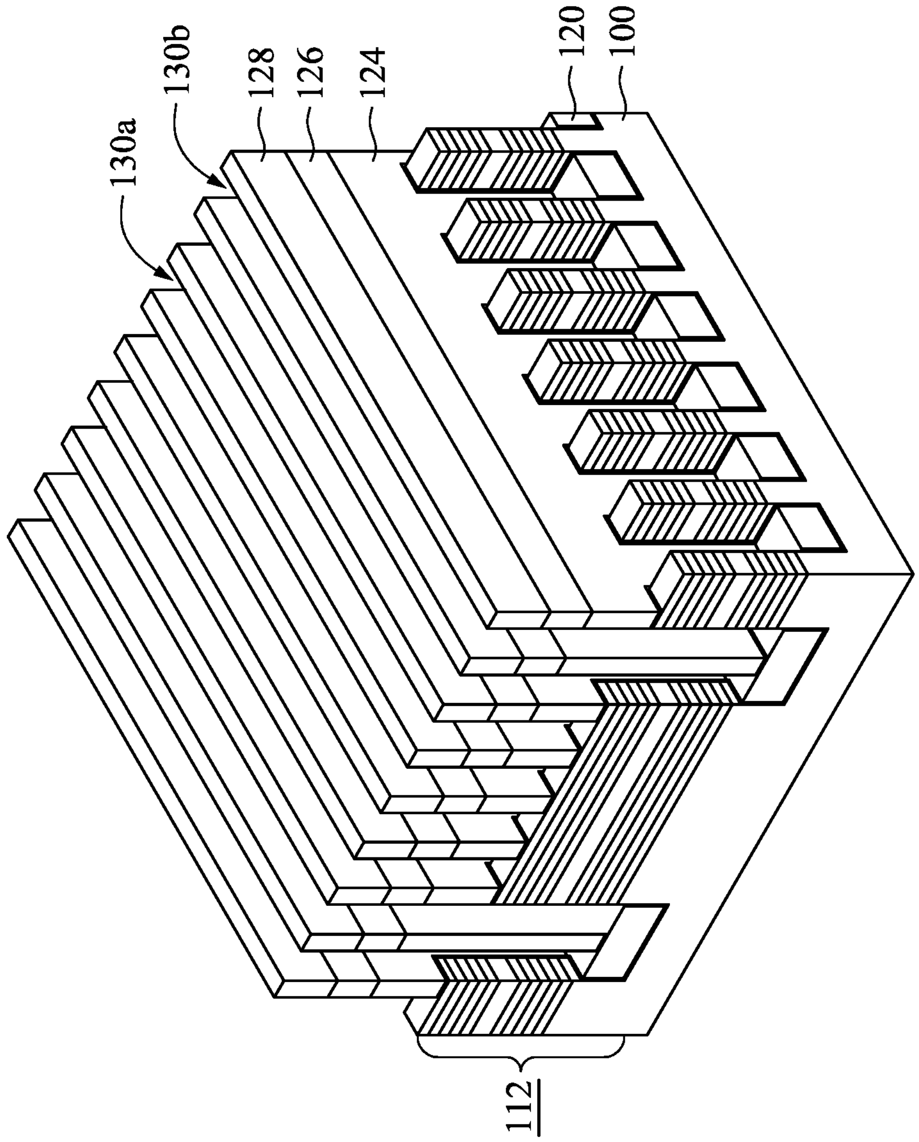

In FIGS. 13A and 13B, a resist layer 128 is formed and patterned on the hard mask layer 126. In one embodiment, the resister layer 128 may include an oxide layer formed by PEALD or other suitable processes. The dummy gate layer 124 is then patterned using acceptable photolithography and etching techniques with the resist layer 128 as a mask. In the embodiment as shown in FIGS. 13A and 13B, trenches 130_a_ are formed to partially extend through the dummy gate layer 124 to expose the stack of semiconductor layers 103, while the trenches 130_b_ are formed to completely extend through the dummy gate layer 124 and to expose the STI 120.

Figure 14A:
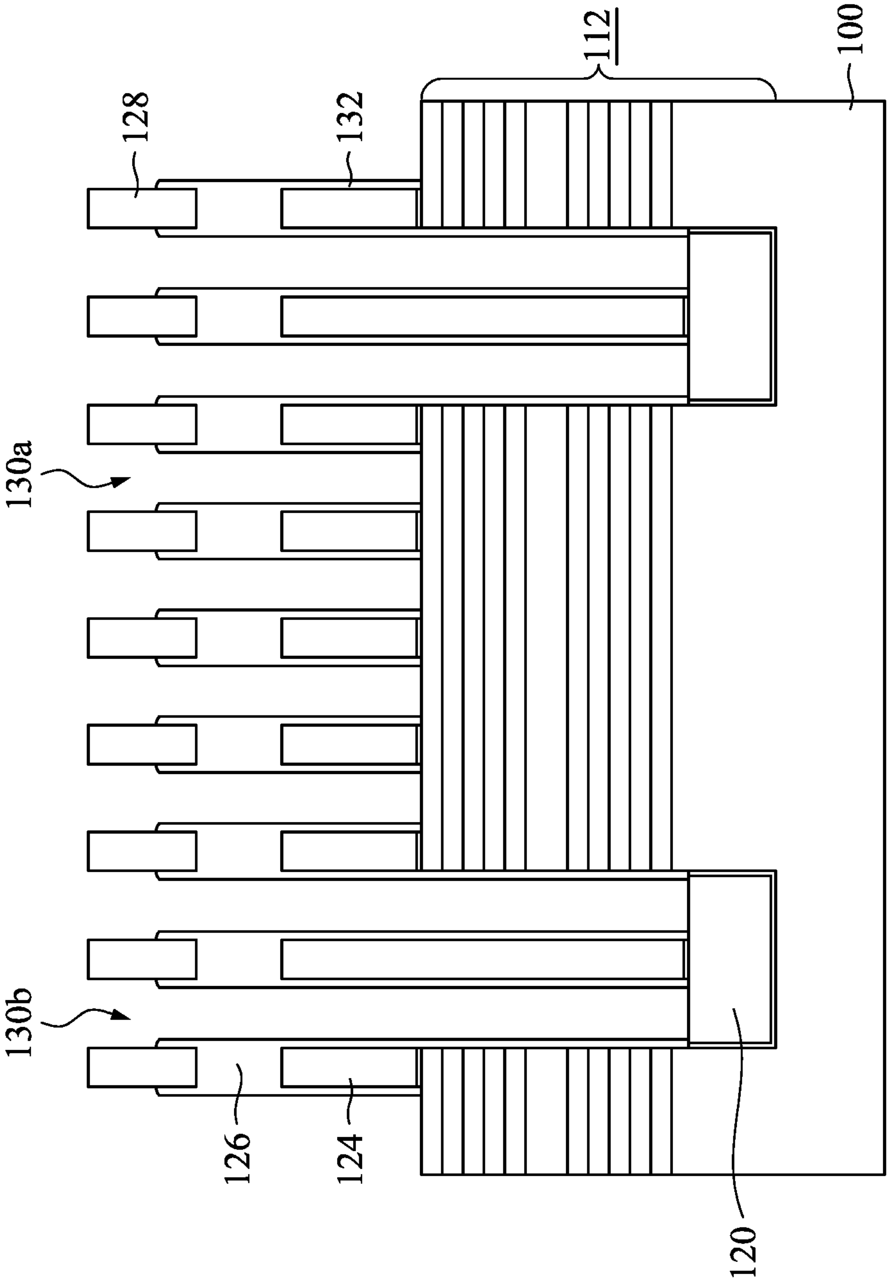
FIGS. 14A and 14B are a cross-sectional view and a perspective view of a stage of manufacturing a CFET device structure, respectively, in accordance with some embodiments.
Figure 14B:
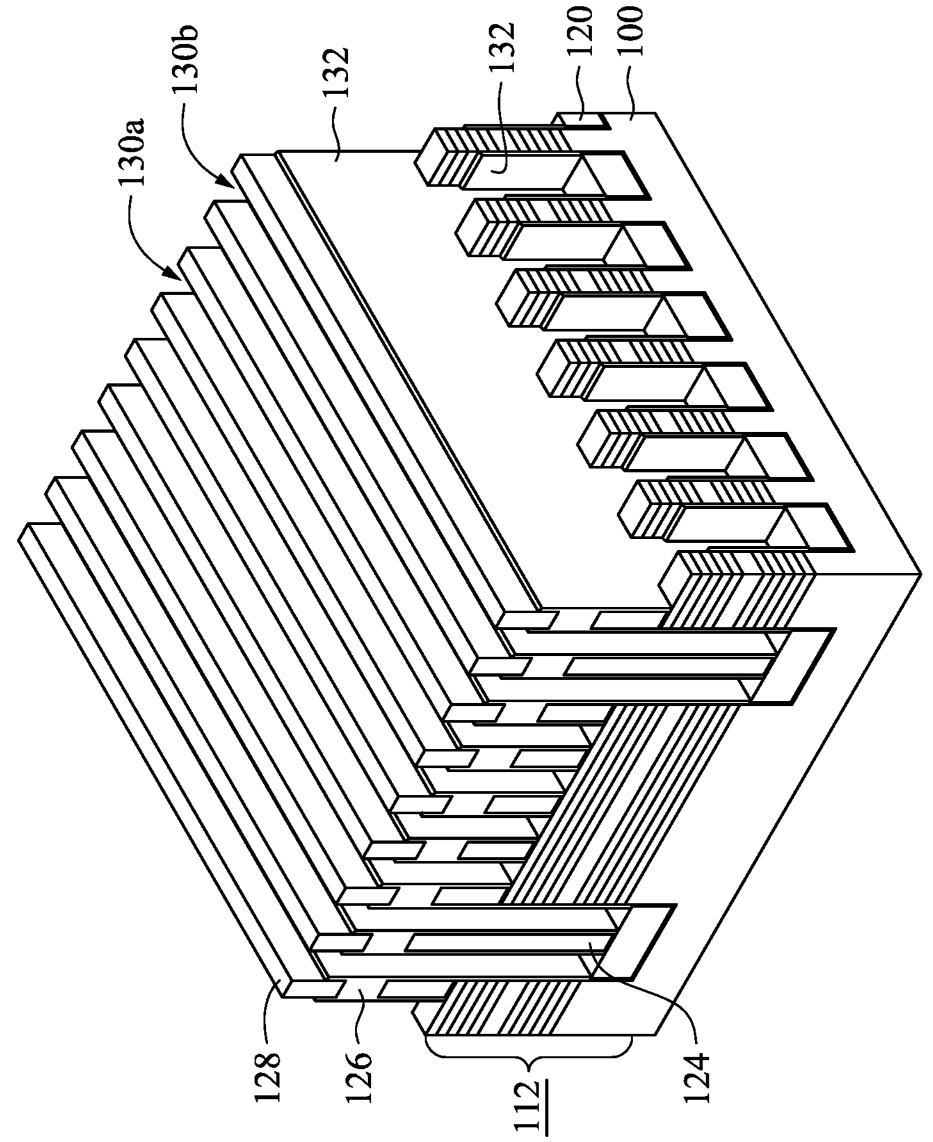

A conformal spacer layer 132 is then formed on sidewalls of the patterned dummy gate layers 124 as shown in FIGS. 14A and 14B. In some embodiments, the spacer layer 132 may include nitride-containing layer such as $Si_3N_4$ layer formed by flowable CVD, ALD, or other suitable deposition processes. The conformal spacer layer 132 may be formed by first forming a conformal layer on the exposed surfaces, followed by an anisotropic etch process to remove portions of the conformal layer formed on horizontal surfaces, leaving the resulting conformal spacer layer 132 formed on vertical surfaces. In some embodiments, the portion of the conformal spacer layer 132 formed on the sidewalls of the resist layer 128 may be recessed or removed by the anisotropic etch process.

Figure 15A:
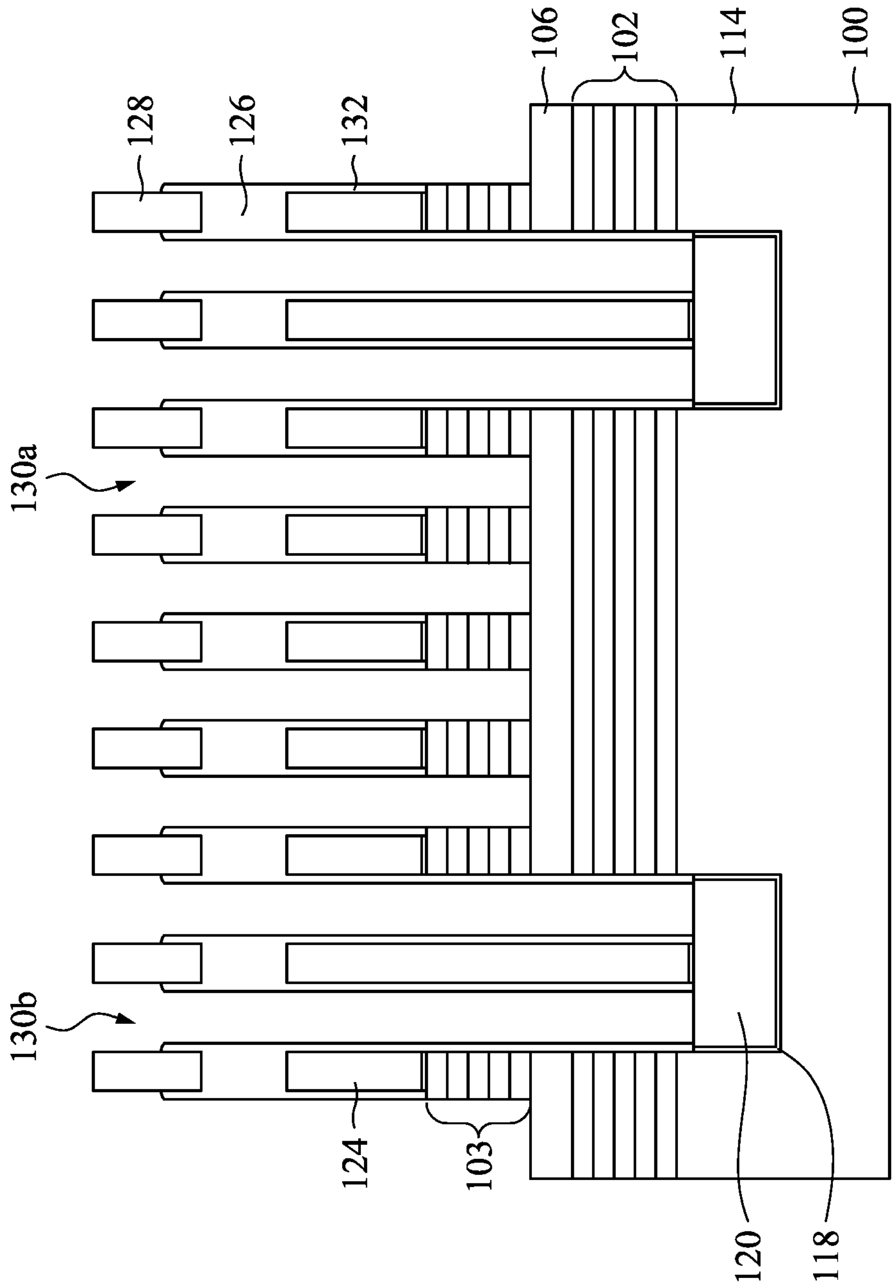
FIGS. 15A and 15B are a cross-sectional view and a perspective view of a stage of manufacturing a CFET device structure, respectively, in accordance with some embodiments.
Figure 15B:
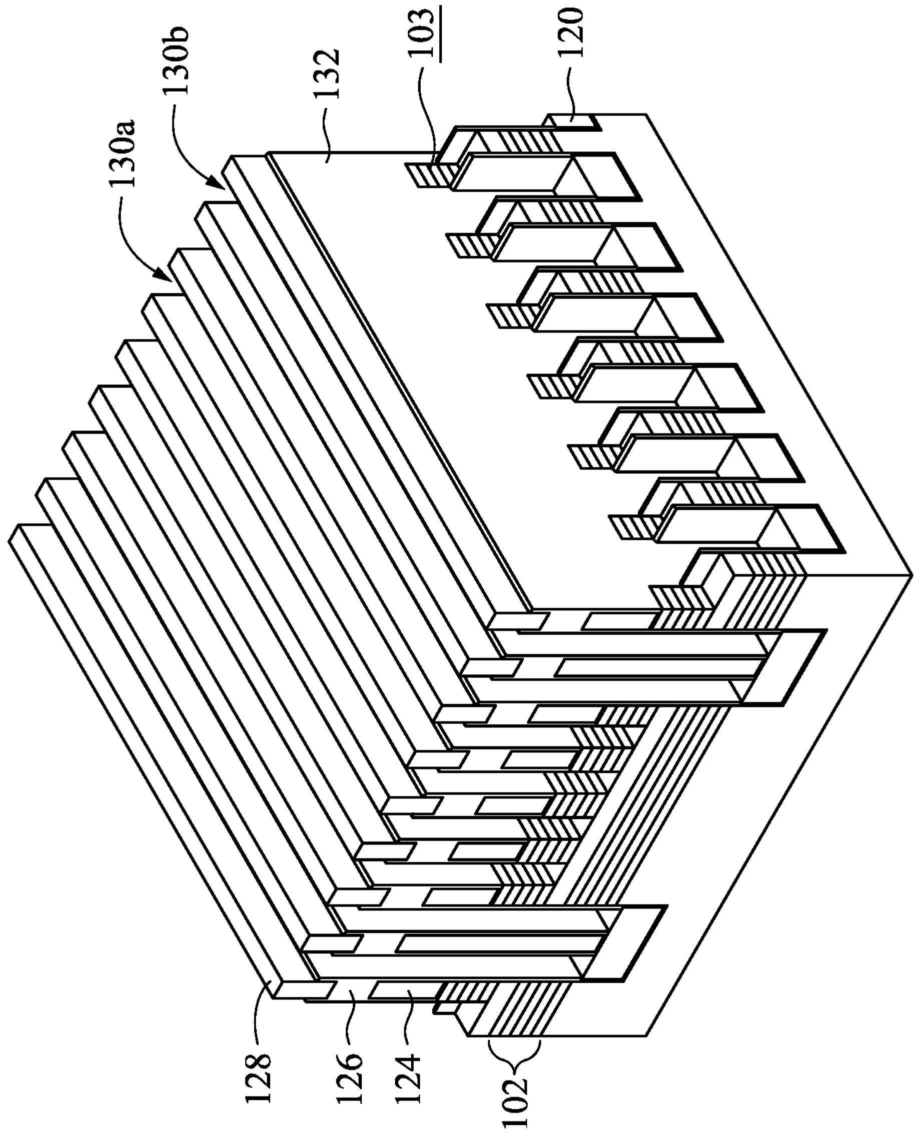

In FIGS. 15A and 15B, the trenches 130*a* are deepened to define the active regions, that is, the source and drain (S/D) regions of the top FET in the CFET structure. As shown, the stack of semiconductor layers 103 exposed within the trenches 130*a* is removed to expose the underlying MDI layer 106 and the sidewalls of the remaining stack of semiconductor layers 103 within the trenches 130*a*. In some embodiments, the stack of semiconductor layers 103 may be removed by suitable dry etching process such as reactive ion etch (RIE), neutral beam etch (NBE), a combination thereof, or other suitable etching processes. In some embodiments, the sidewalls of the stack of semiconductor layers 103 in the trenches 130*a* may be flush with the conformal spacer layer 132, as shown in FIGS. 15A and 15B.

Figure 16:
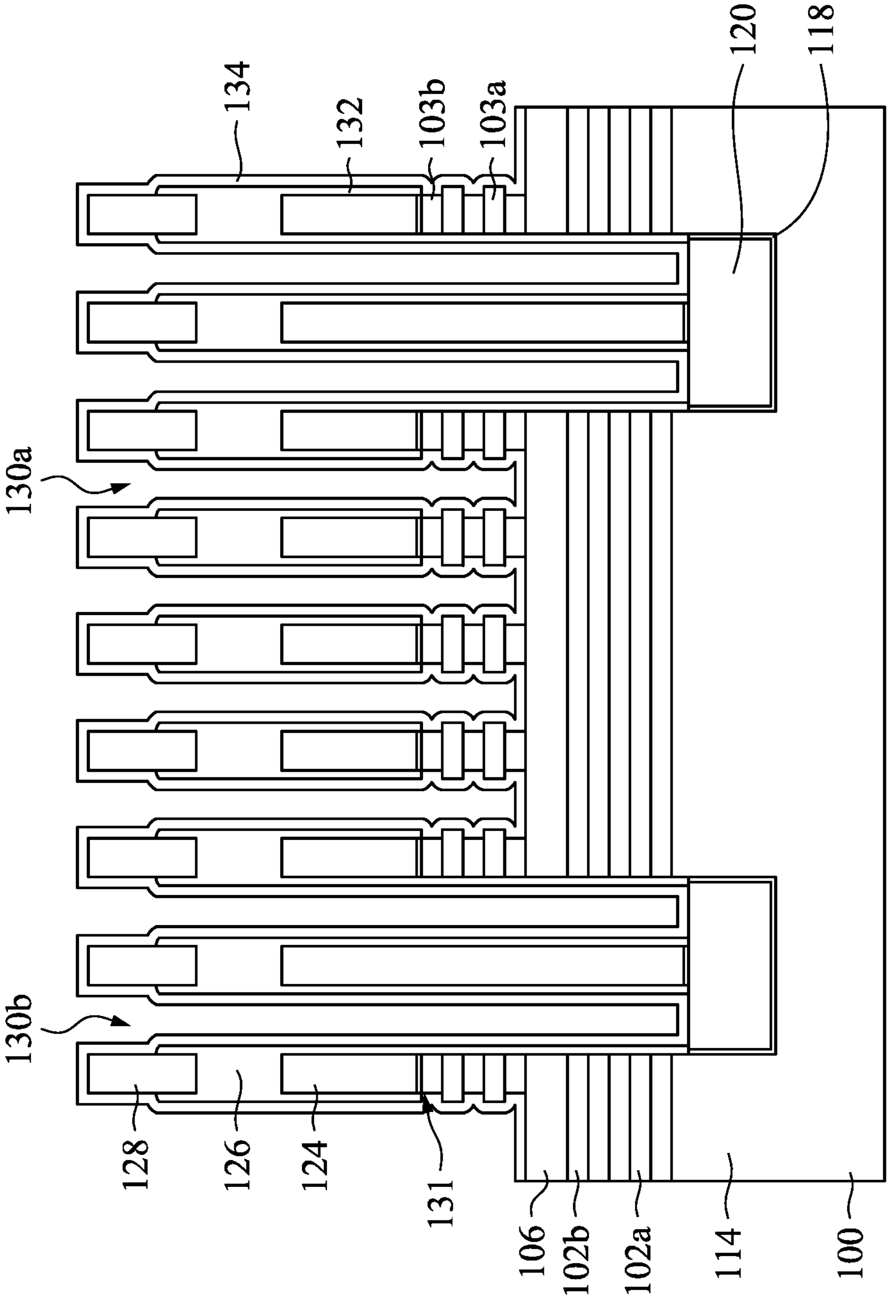
FIG. 16 is a cross-sectional view of a stage of manufacturing a CFET device structure in accordance with some embodiments.

As shown in FIGS. 16, an etch process is performed in a lateral direction, that is, x-direction, to remove edge or peripheral portions of the second semiconductor layers 103*b* exposed within the extended trenches 130*a*. As a result, the remaining second semiconductor layers 103*b* are recessed from the sidewalls of the adjacent first semiconductor layers 103*a*. In some embodiments, the peripheral portions of the second semiconductor layers 103*b* may be removed by selective wet etching process using etchant with high selectivity between the first semiconductor layers 103*a* and second semiconductor layers 103*b*. In the case that the second semiconductor layers 103*b* are made of SiGe and the first semiconductor layers 103*a* are made of Si, a wet etching process may be performed by using wet etchant such as ammonium hydroxide ($NH_4OH$), tetramethylammonium hydroxide (TMAH), ethylenediamine pyrocatechol (EDP), potassium hydroxide (KOH) solutions, or other suitable etchants. The etch process creates cavities 133 at the peripheries of the second semiconductor layers 103*b* within the trenches 130*a*. As the sidewalls of the second semiconductor layers 103*b* within the trenches 130*b* are covered with the spacer layers 132, no cavities are formed within the trenches 130*b*.

A conformal dielectric layer 134 is formed to cover the exposed surface of the CFET device as shown in FIG. 16 and to fill the cavities at the peripheries of the second semiconductor layers 103*b*. The conformal dielectric layer 134 may be made of a low-K dielectric material with a good gap filling effect such as $Si_3N_4$, SiON, SiCN, SiOC, SiOCN, $SiO_2$, $Al_2O_3$, or other suitable material. In some embodiments, the conformal dielectric layer 134 and the conformal spacer layer 132 include different materials having different etch selectivity in an etch process. A conformal deposition process such as ALD, LPCVD, PECVD, or other suitable processes may be performed for forming the conformal dielectric layer 134.

Figure 17A:
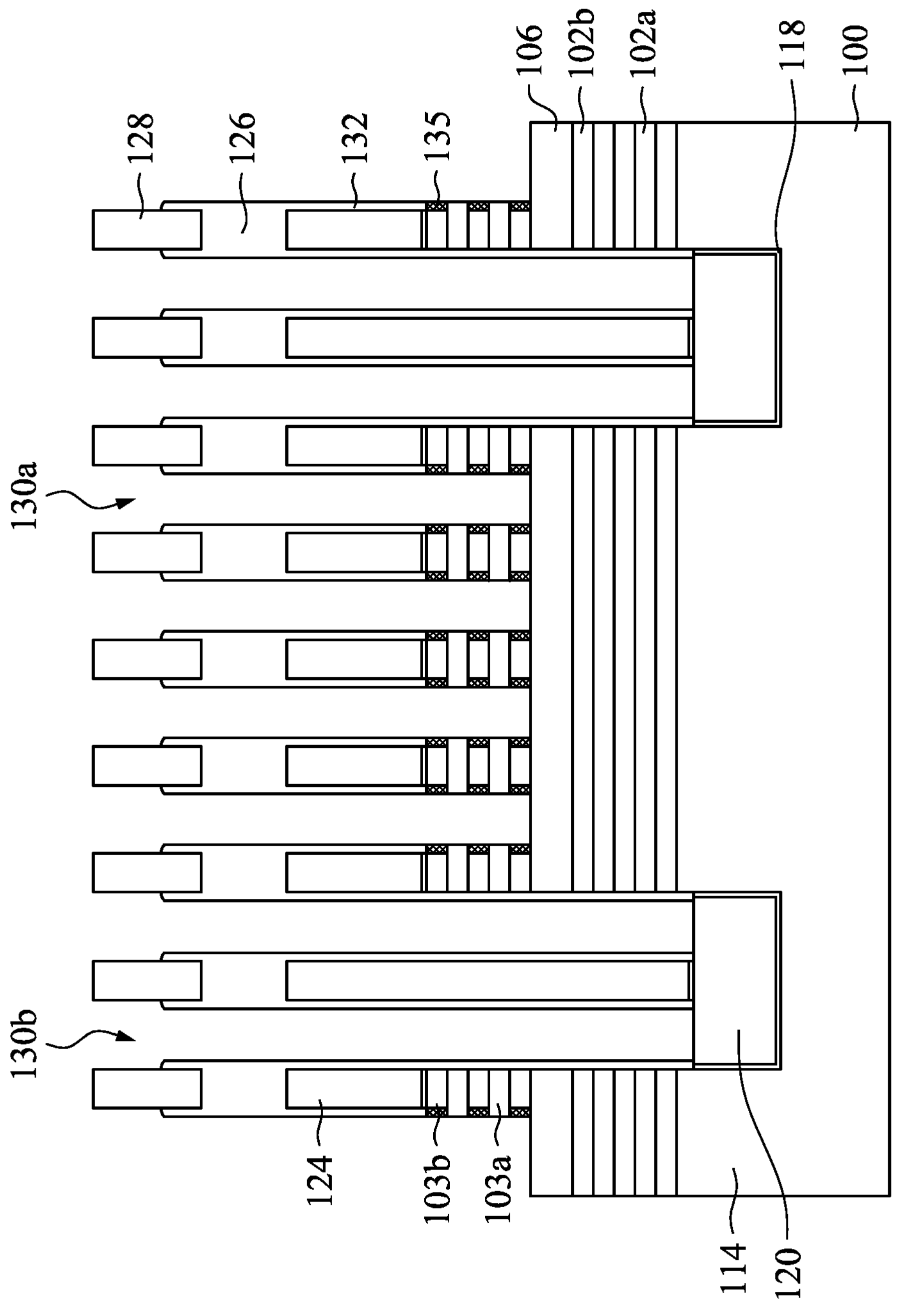
FIGS. 17A and 17B are a cross-sectional view and a perspective view of a stage of manufacturing a CFET device structure, respectively, in accordance with some embodiments.
Figure 17B:
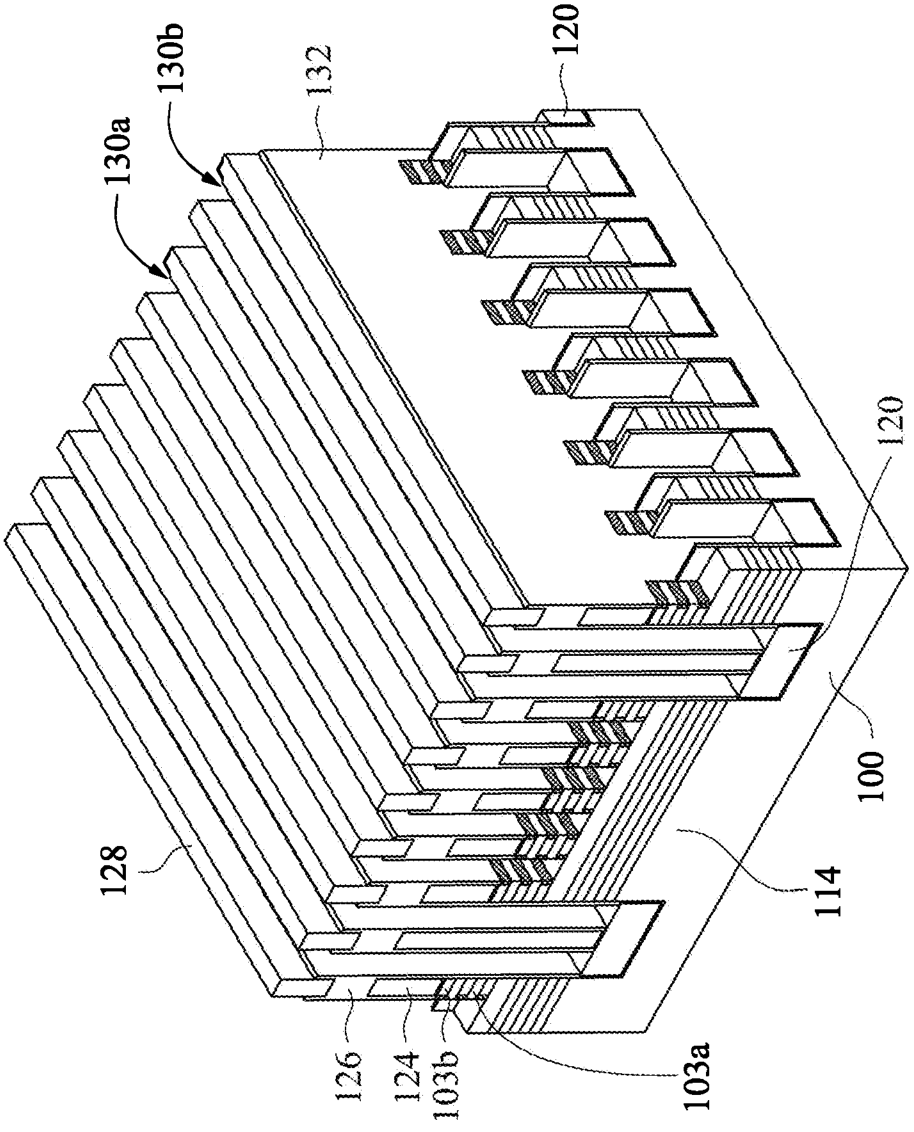

An etch process is performed on the conformal dielectric layer 134 to form an inner spacer 135 in each of the cavity at the periphery of each of the second semiconductor layers 103*b* as shown in FIGS. 17A and 17B. In some embodiments, the etching process may include an anisotropic etching process with a high etch selectivity ratio to Si and a high vertical to lateral etch ratio. The etch process does not substantially affect the conformal spacer layer 132, because the conformal spacer layer 132 includes a material different from the material of the conformal dielectric layer 134.

Figure 18A:
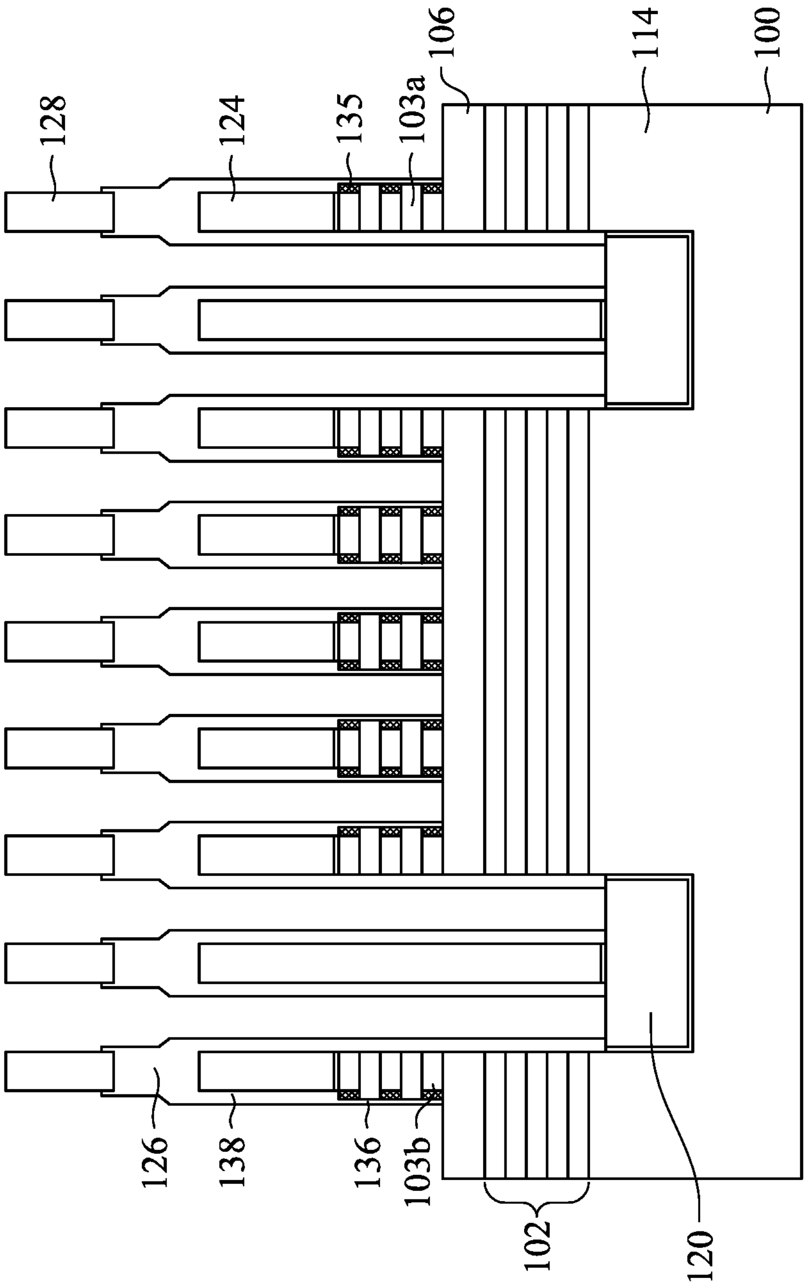
FIGS. 18A and 18B are a cross-sectional view and a perspective view of a stage of manufacturing a CFET device structure, respectively, in accordance with some embodiments.
Figure 18B:
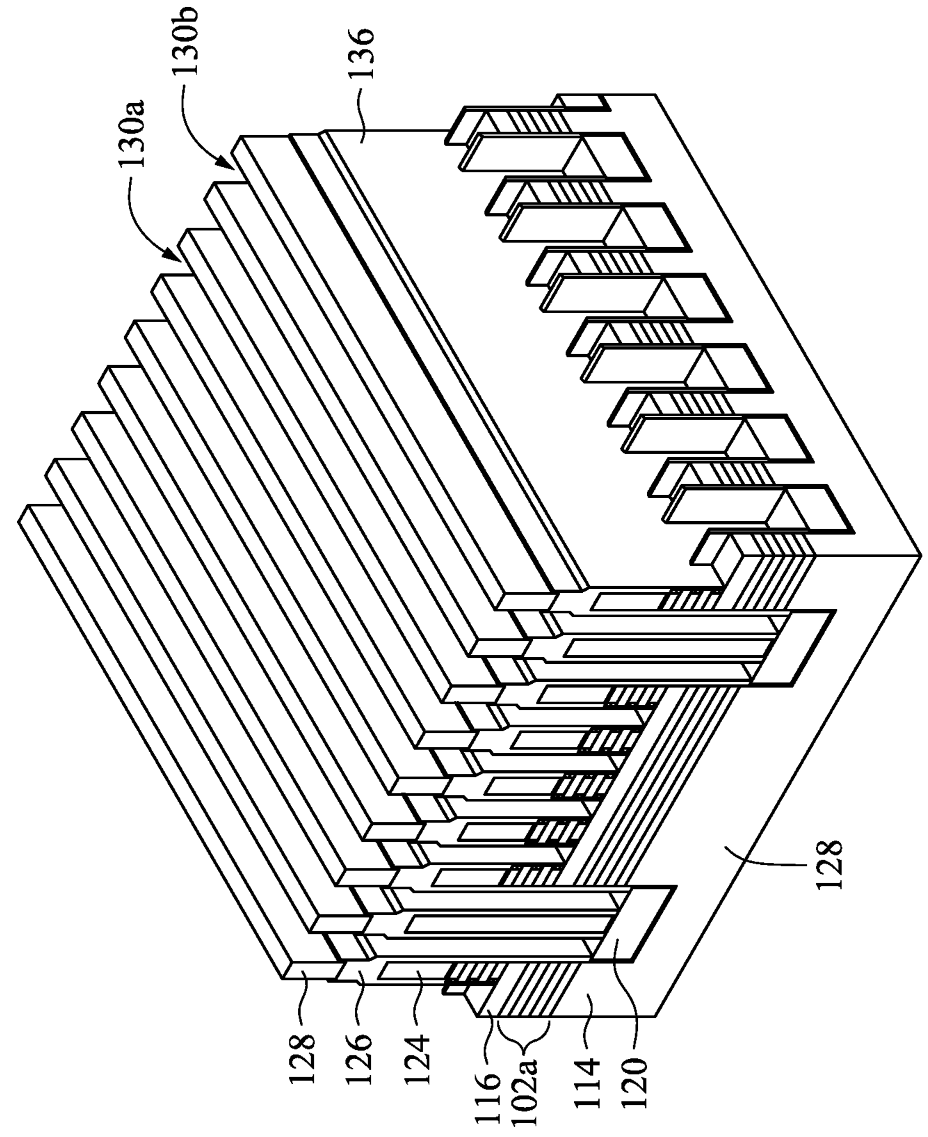

As shown in the cross-sectional view and the perspective view in FIGS. 18A and 18B, an inner spacer cover layer 136 is formed to cover the inner spacer 135 within the trenches 107*a*. The inner spacer cover layer 136 may also be formed on the spacer layer 132, and the combined spacer layer 132 and the inner spacer cover layer 136 is denoted with the reference numeral 138 as shown in FIGS. 18A and 18B. In some embodiments, the inner spacer cover layer 136 may be made of the same materials as the inner spacer 135 or the spacer layer 132. For example, materials such as $Si_3N_4$, SiCO, $SiO_2$, SiON, $Al_2O_3$ may be used to form the inner spacer cover layer 136 using processes such as ALD, PEALD, or other suitable processes. The inner spacer cover layer 136 may be formed by first forming a conformal layer on the exposed surfaces, followed by an anisotropic etch process to remove portions of the conformal layer formed on horizontal surfaces, leaving the resulting inner spacer cover layer 136 formed on vertical surfaces. In some embodiments, the portion of the conformal spacer layer 132 formed on the sidewalls of the resist layer 128 and the hard mask layer 126 may be recessed or removed by the anisotropic etch process.

Figure 19:
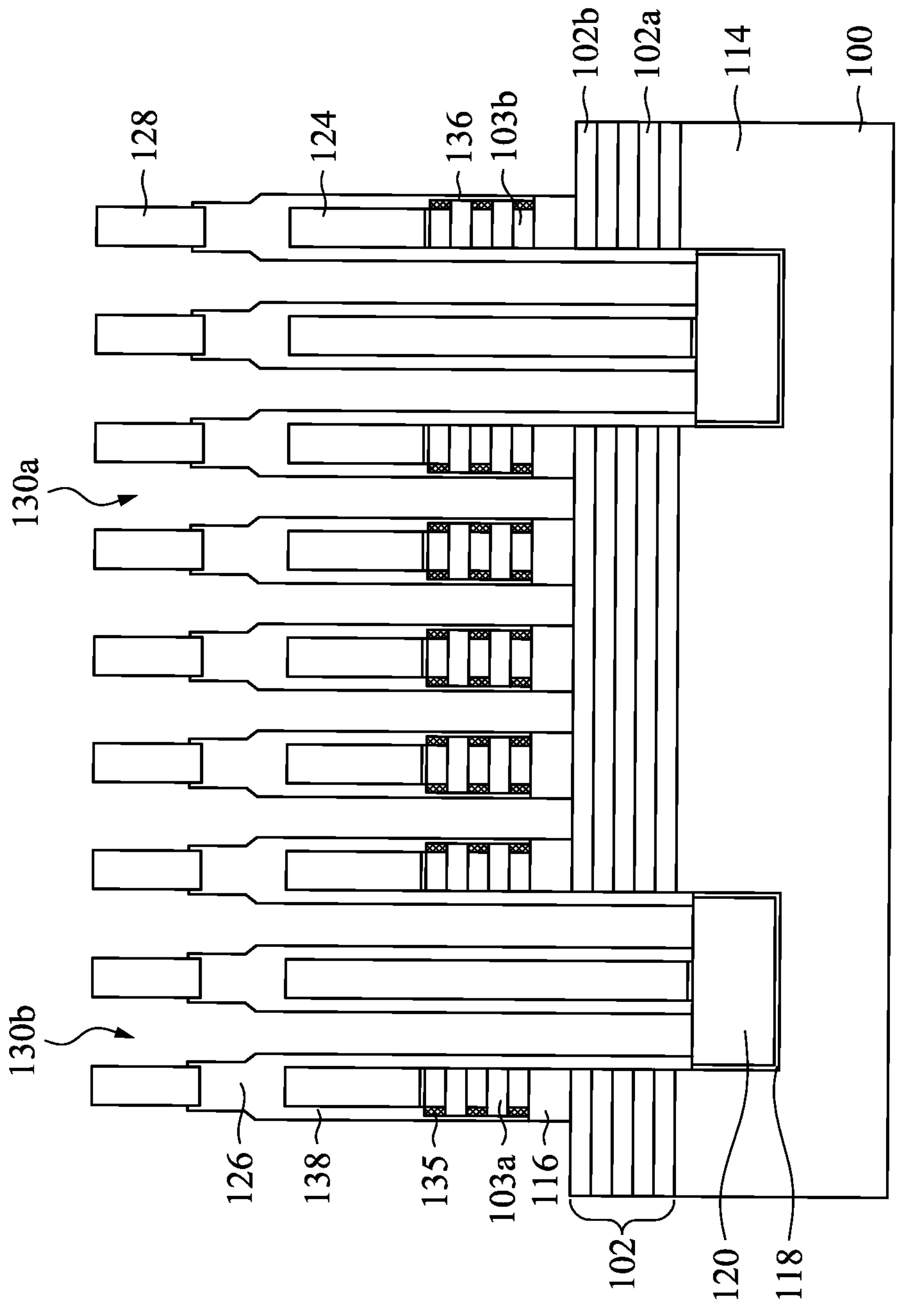
FIG. 19 is a cross-sectional view of a stage of manufacturing a CFET device structure in accordance with some embodiments.
Figure 20A:
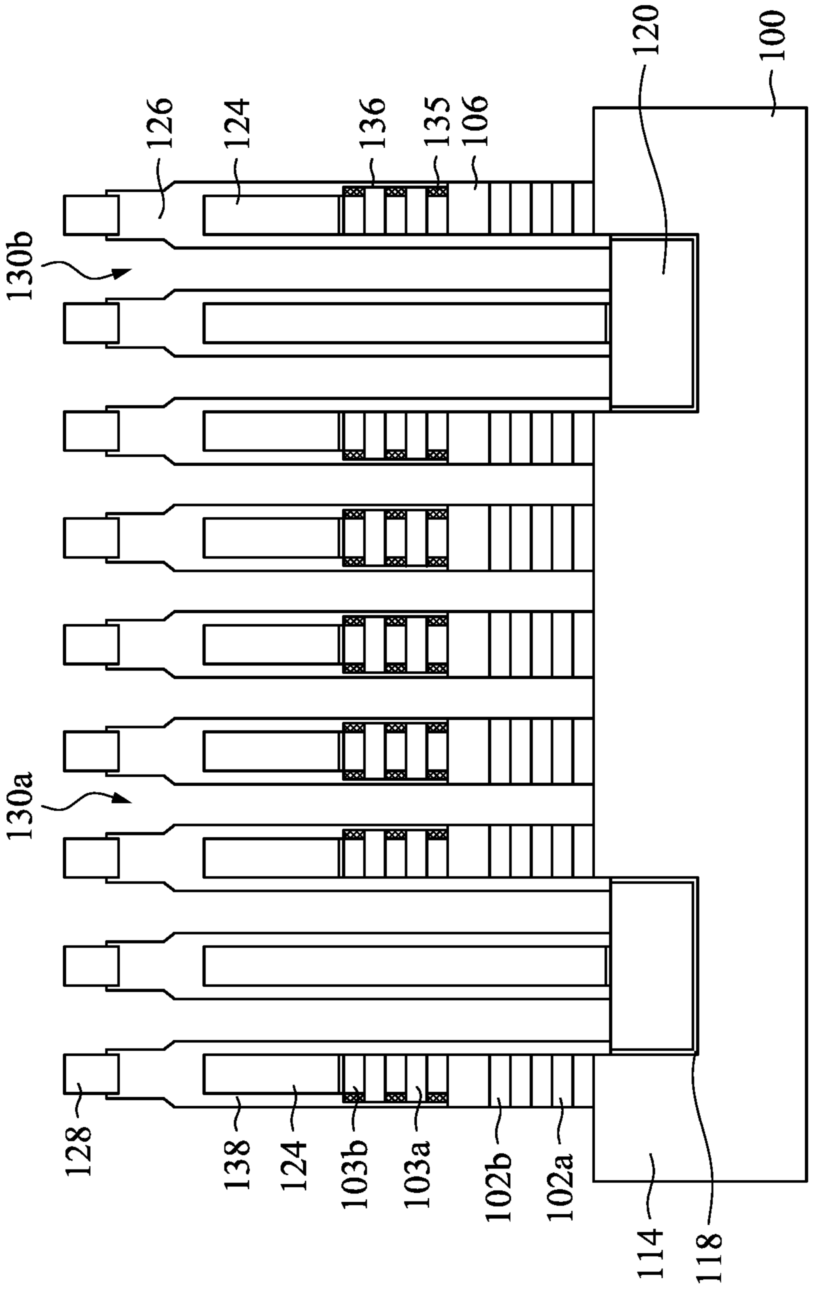
FIGS. 20A and 20B are a cross-sectional view and a perspective view of a stage of manufacturing a CFET device structure, respectively, in accordance with some embodiments.
Figure 20B:
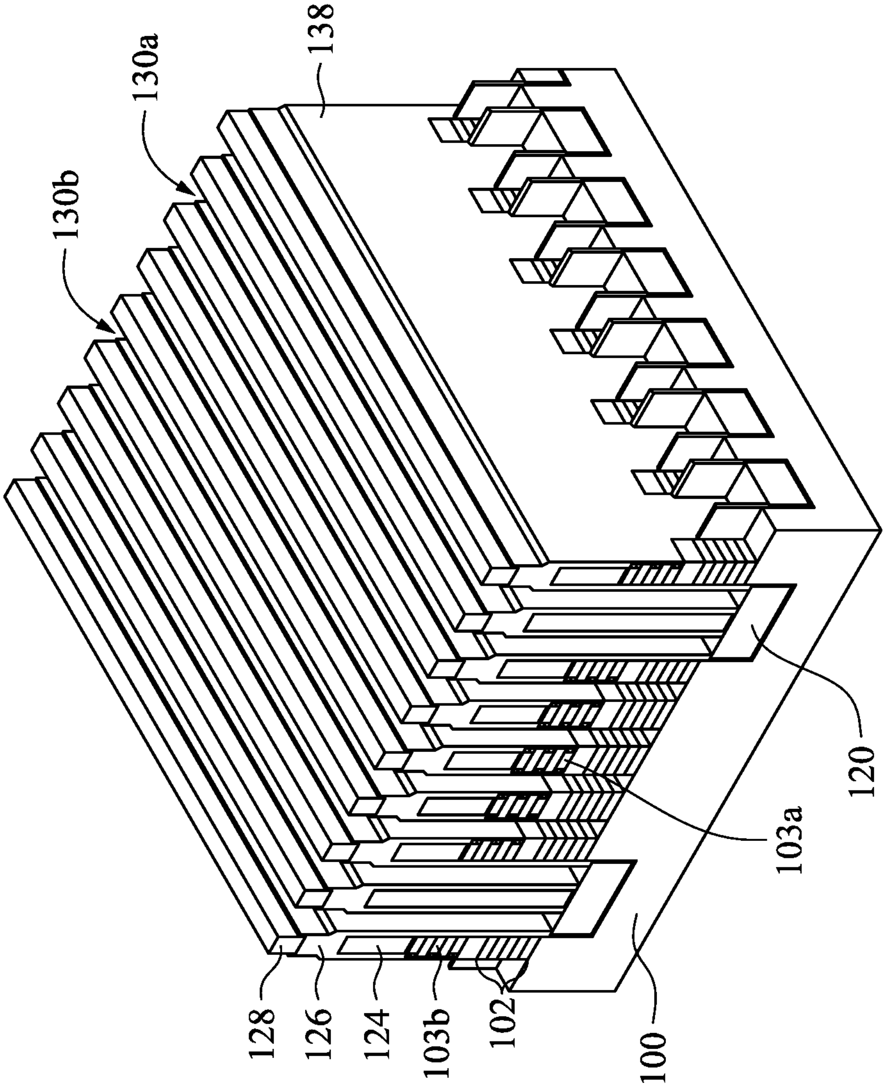

In FIG. 19, the portions of the MDI layer 106 exposed within the trenches 130*a* are removed to expose the underlying stack of semiconductor layers 102. In FIGS. 20A and 20B, the trenches 130*a* are further extended to define the active regions, that is, the source and drain (S/D) regions of the bottom FET in the CFET structure. As shown, the portions of the stack of semiconductor layers 102 exposed within the trenches 130*a* are removed to expose the underlying substrate layer 100. The sidewalls of the remaining stack of semiconductor layers 102 within the trenches 130*a* are also exposed. In some embodiments, the stack of semiconductor layers 102 may be removed by suitable dry etching process such as reactive ion etch (RIE), neutral beam etch (NBE), a combination thereof, or other suitable etching processes. In some embodiments, the sidewalls of the stack of semiconductor layers 102 in the trenches 130*a* may be flush with the inner spacer cover layer 136, as shown in FIGS. 20A and 20B.

Figure 21A:
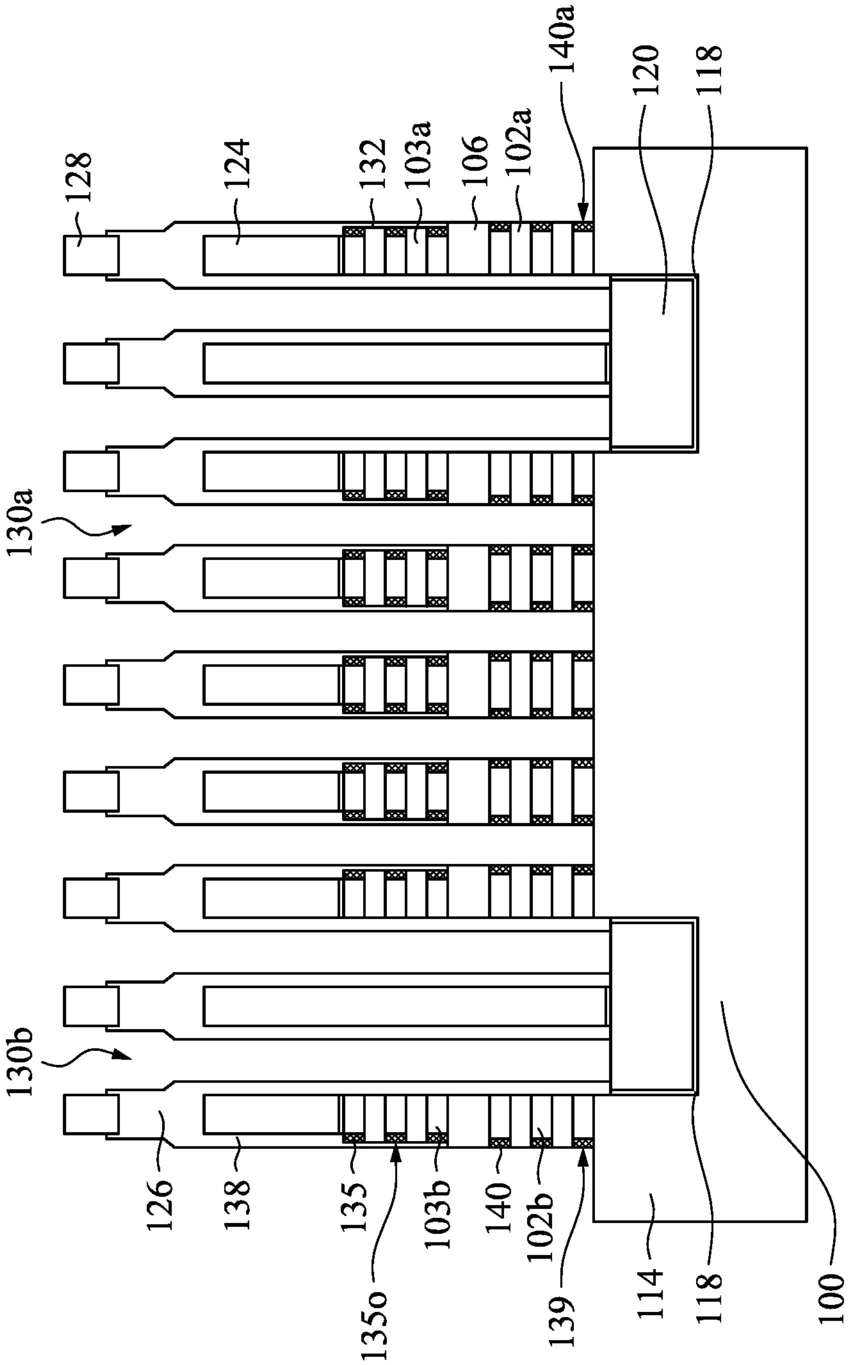
FIGS. 21A and 21B are a cross-sectional view and a perspective view of a stage of manufacturing a CFET device structure, respectively, in accordance with some embodiments.
Figure 21B:
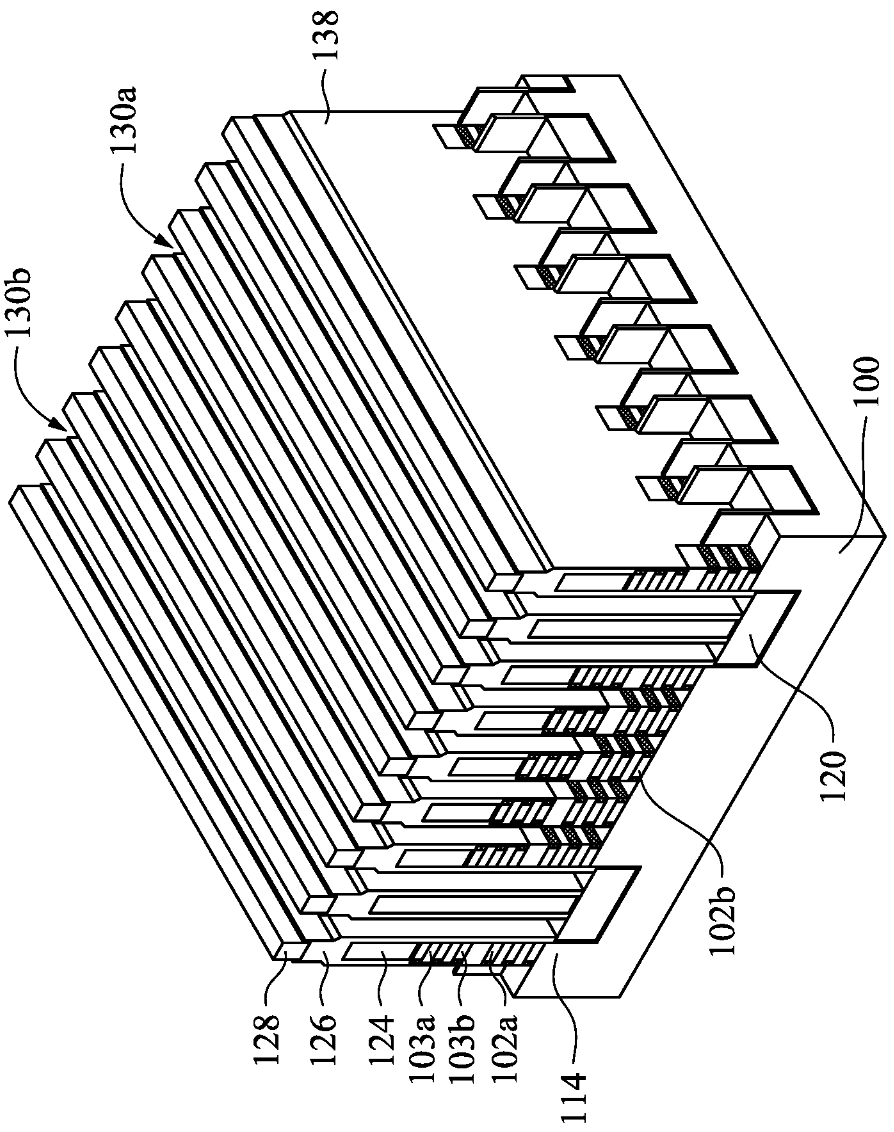

FIGS. 21A and 21B show the cross-sectional views and the perspective views of the CFET device of which the inner spacer for the bottom FET is formed. After the regions for forming the source/drain regions of the bottom FET are defined, an etch process is performed in a lateral direction, that is, x-direction, to remove edges or peripheral portions of the second semiconductor layers 102*b* exposed within the further extended trenches 130*a*. As a result, the remaining second semiconductor layers 102*b* are recessed from the sidewalls of the adjacent first semiconductor layers 102*a*. In some embodiments, the peripheral portions of the second semiconductor layers 102*b* may be removed by selective wet etching process. In the case that the second semiconductor layers 102*b* are made of SiGe and the first semiconductor layers 102*a* are made of Si, a wet etching process may be performed by using wet etchant such as ammonium hydroxide ($NH_4OH$), tetramethylammonium hydroxide (TMAH), ethylenediamine pyrocatechol (EDP), potassium hydroxide (KOH) solutions, or other suitable etchants. Cavities 139 are formed at the peripheries of the second semiconductor layers 102*b* exposed within the trenches 130*a*, but the second semiconductor layers 102*b* within the trenches 130*b* as the peripheries (sidewalls) of the semiconductor layers 102*a* and 102*b* are both protected by the spacer layer 132 and the inner spacer cover layer 136. The inner spacer 140 and the inner spacer 135 are formed by different processes at different times. In some embodiments, an outer surface 1400 (please add it to the figures) of the inner spacer 140 and an outer surface 1350 (please add it to the figures) of the inner spacer are misaligned. For example, in some embodiments, the outer surface 1400 extends further out along the x-axis than the outer surface 1350. In some embodiments, the dimensions of the inner spacer 135 are different from the dimensions of the inner spacer 140. For example, the dimensions of the inner spacer 140 may be substantially greater than the dimensions of the inner spacer 135.

Figure 22A:
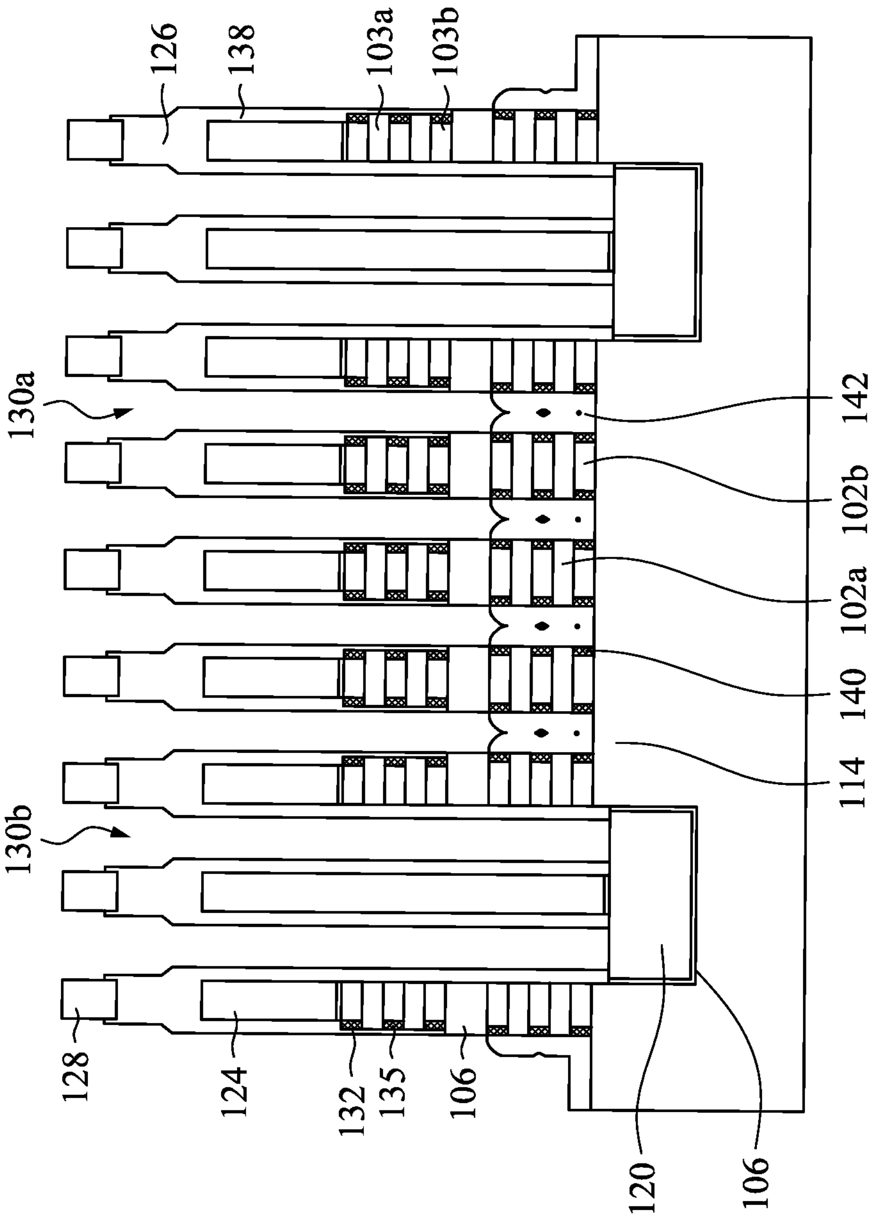
FIGS. 22A and 22B are a cross-sectional view and a perspective view of a stage of manufacturing a CFET device structure, respectively, in accordance with some embodiments.
Figure 22B:
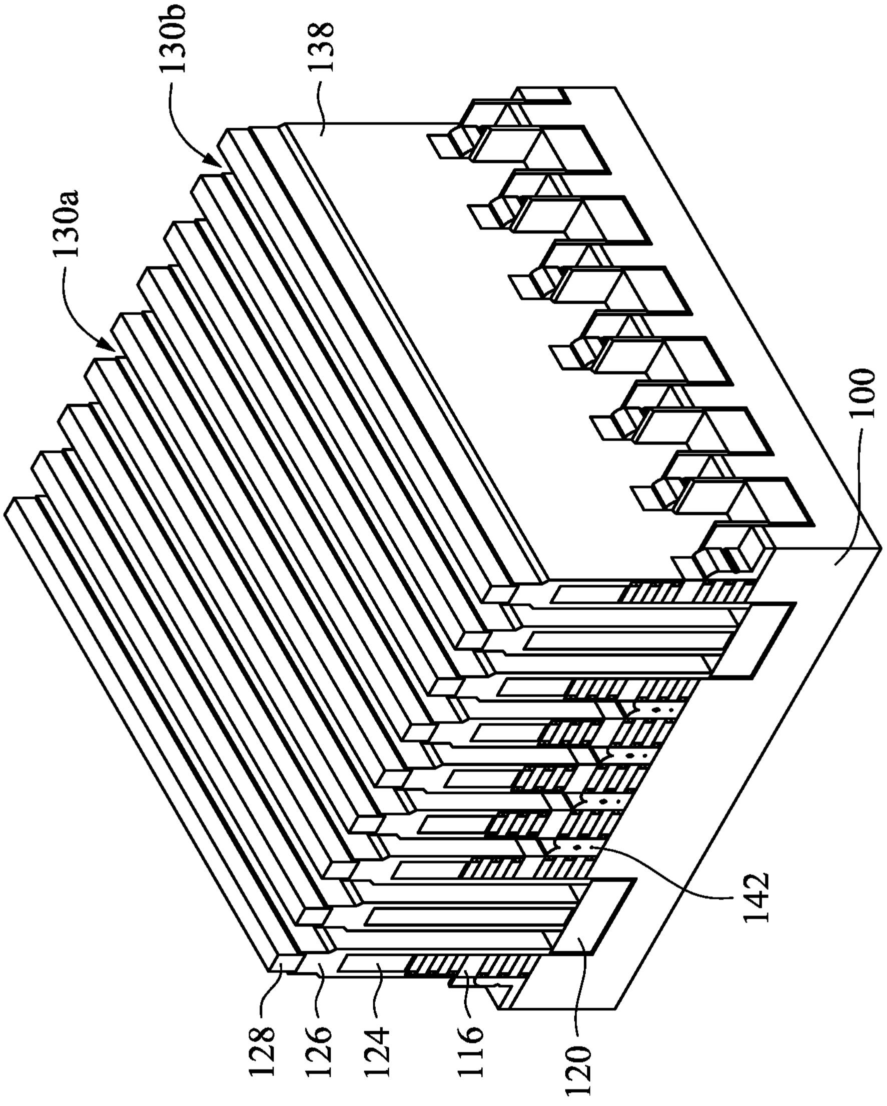

In FIGS. 22A and 22B, source/drain regions 142 of the lower FET of the CFET device are epitaxially grown from on the well portions 114 and the first semiconductor layers 102*a*. The epitaxially grown source/drain regions 142 may include one or more layers of Si, SiP, SiC and SiCP for n-channel FETs or Si, SiGe, Ge for p-channel FETs. For p-channel FETs, p-type dopants, such as boron (B), may also be included in the epitaxial S/D features 142. In the embodiments as shown in FIGS. 22A and 22B, the epitaxial S/D regions 142 include one or more layers of Si, SiGe, and Ge for a p-channel FET. The epitaxial S/D regions 142 may be formed by an epitaxial growth method using CVD, ALD or MBE. The epitaxial S/D regions 142 may grow both vertically and horizontally to form facets, which may correspond to crystalline planes of the material used for the substrate 100. The epitaxial S/D regions 142 extending from the well portion 114 and the first semiconductor layers 102*a* to a level near the bottom of the MDI layer 116 are in contact with the inner spacers 140. In this disclosure, a source region and a drain region are interchangeably used, and the structures thereof are substantially the same. Furthermore, source/drain region(s) may refer to a source or a drain, individually or collectively dependent upon the context.

Figure 23A:
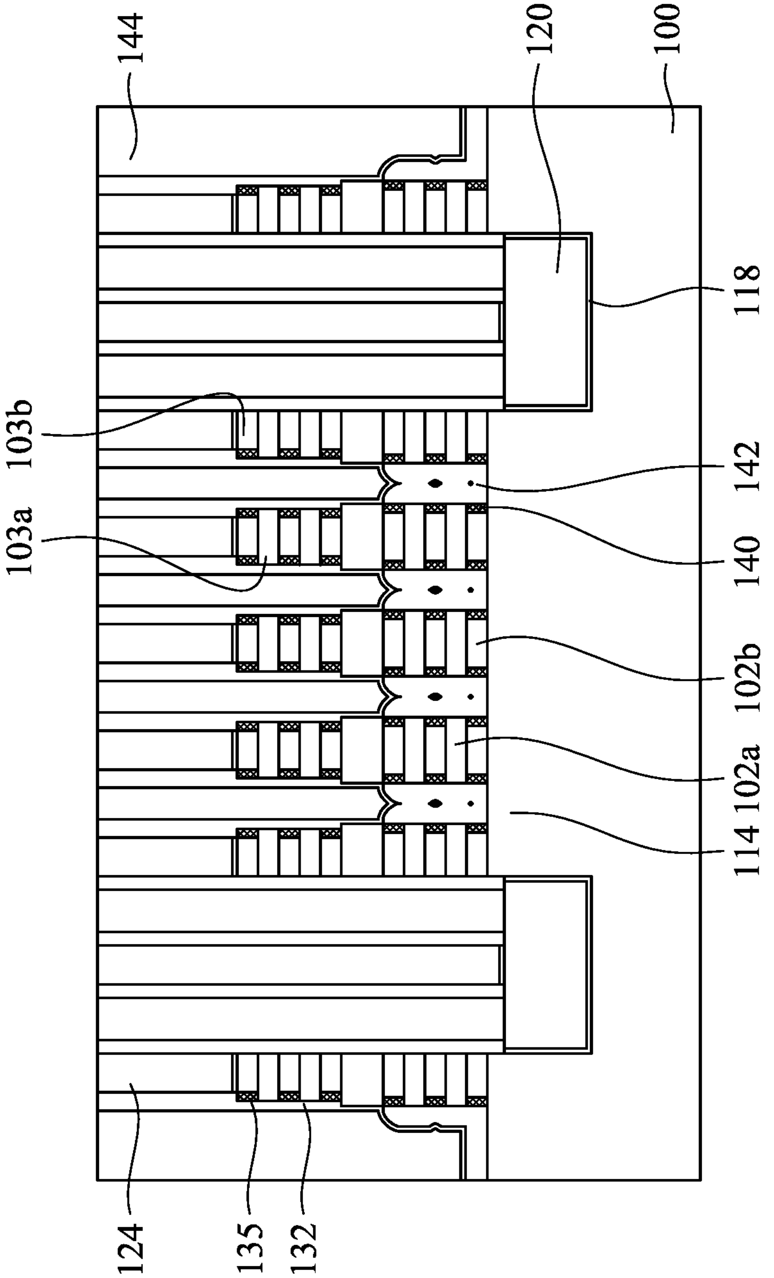
FIGS. 23A and 23B are a cross-sectional view and a perspective view of a stage of manufacturing a CFET device structure, respectively, in accordance with some embodiments.
Figure 23B:
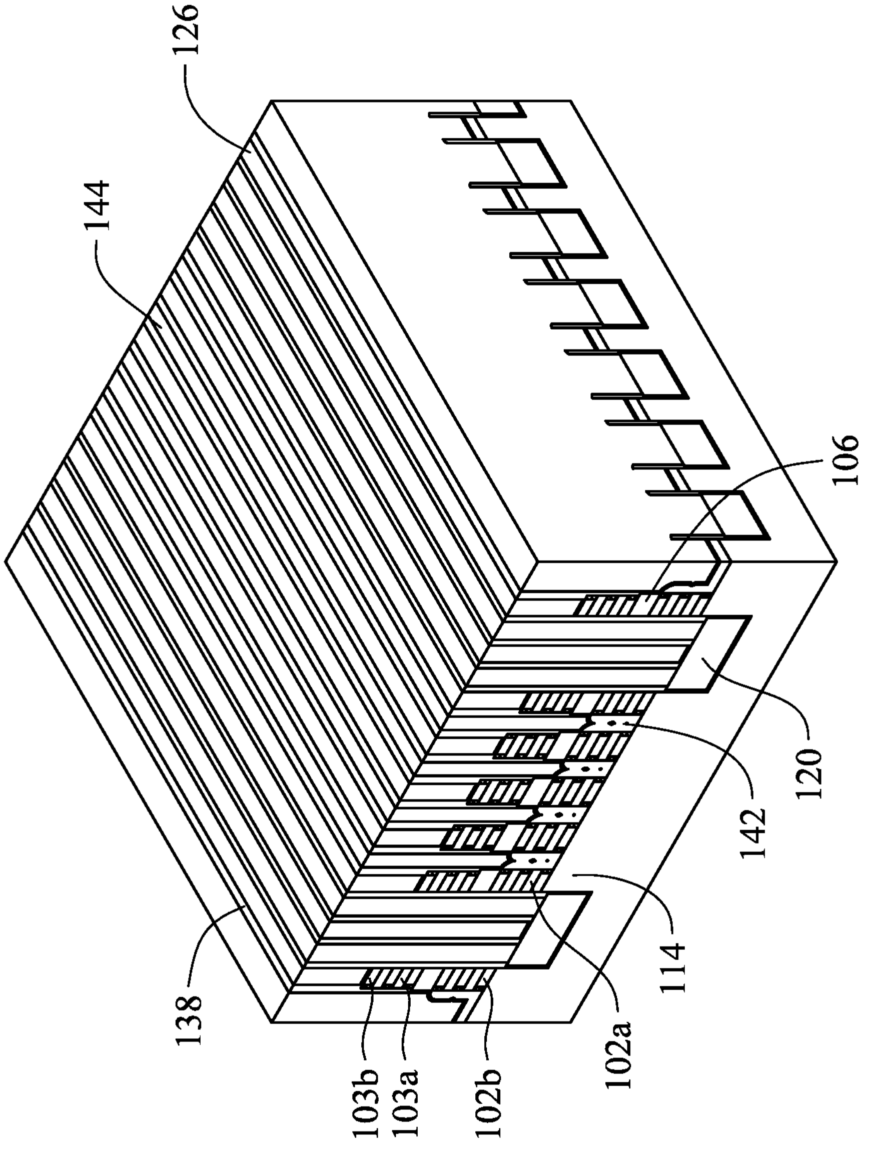

After the S/D regions 142 of the bottom FET are formed, an interlayer dielectric (ILD) 144 is formed to fill the trenches 130*a* and 130*b*, as shown in FIGS. 23A and 23B. The ILD 144 may be formed over the resist layer 128, followed by a planarization process. As shown in FIGS. 23A and 23B, the resist layer 128 and the hard mask 126 are removed by the planarization process, and the dummy gate layer 124 is exposed after removal of the hard mask 126. In some embodiments, the ILD 144 may be deposited by PEALD or other suitable deposition processes. The materials for the ILD layer 144 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials, such as dielectric materials including Si, O, C, and/or H. The ILD layer 144 may also be deposited by a PECVD process or other suitable deposition technique. Although it is not shown in the drawings, a contact etch stop layer (CESL) may be conformally formed to cover the S/D regions 142 before forming the ILD layer 144, and the ILD layer 144 is formed on the CESL. The CESL may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique.

Figure 24A:
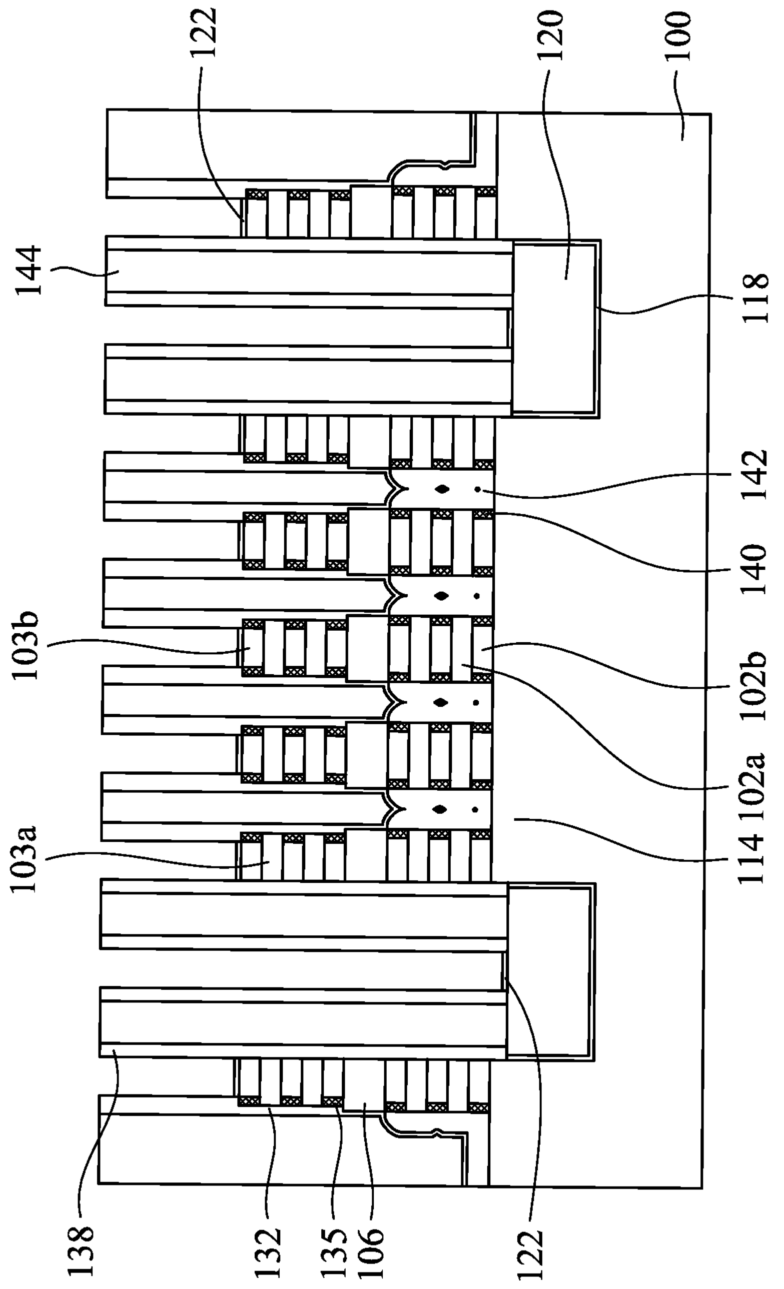
FIGS. 24A and 24B are a cross-sectional view and a perspective view of a stage of manufacturing a CFET device structure, respectively, in accordance with some embodiments.
Figure 24B:
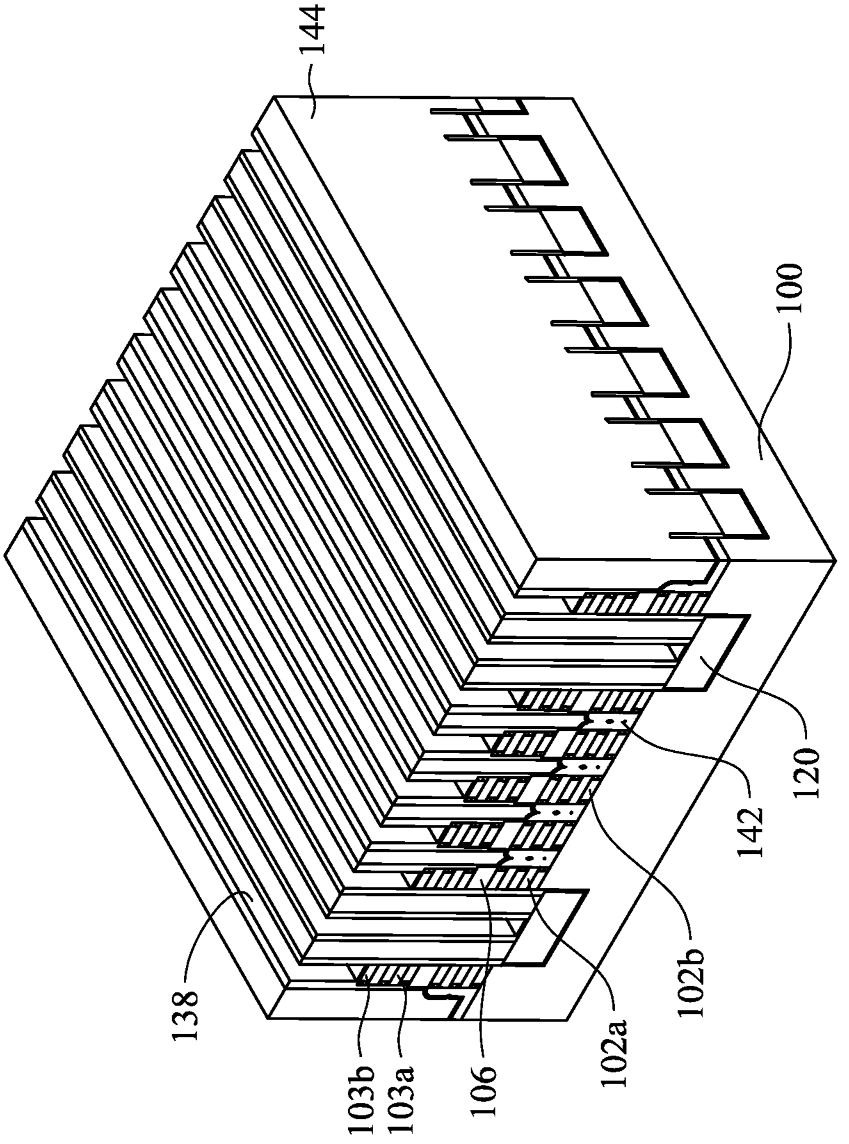

As shown in FIGS. 24A and 24B, the dummy gate layer 124 is removed to expose the underlying sacrificial gate dielectric layer 122. The dummy gate layer 124 may be removed by any suitable process such as dry etch, wet etch, or a combination thereof. The exposed sacrificial dielectric layer 122 is then removed until the stack of semiconductor layers 103 and the STI 120 are exposed. In some embodiments, a wet etchant such as a tetramethylammonium hydroxide (TMAH) solution can be used to selectively remove the dummy gate layer 124 but not the gate spacers 138.

Figure 25A:
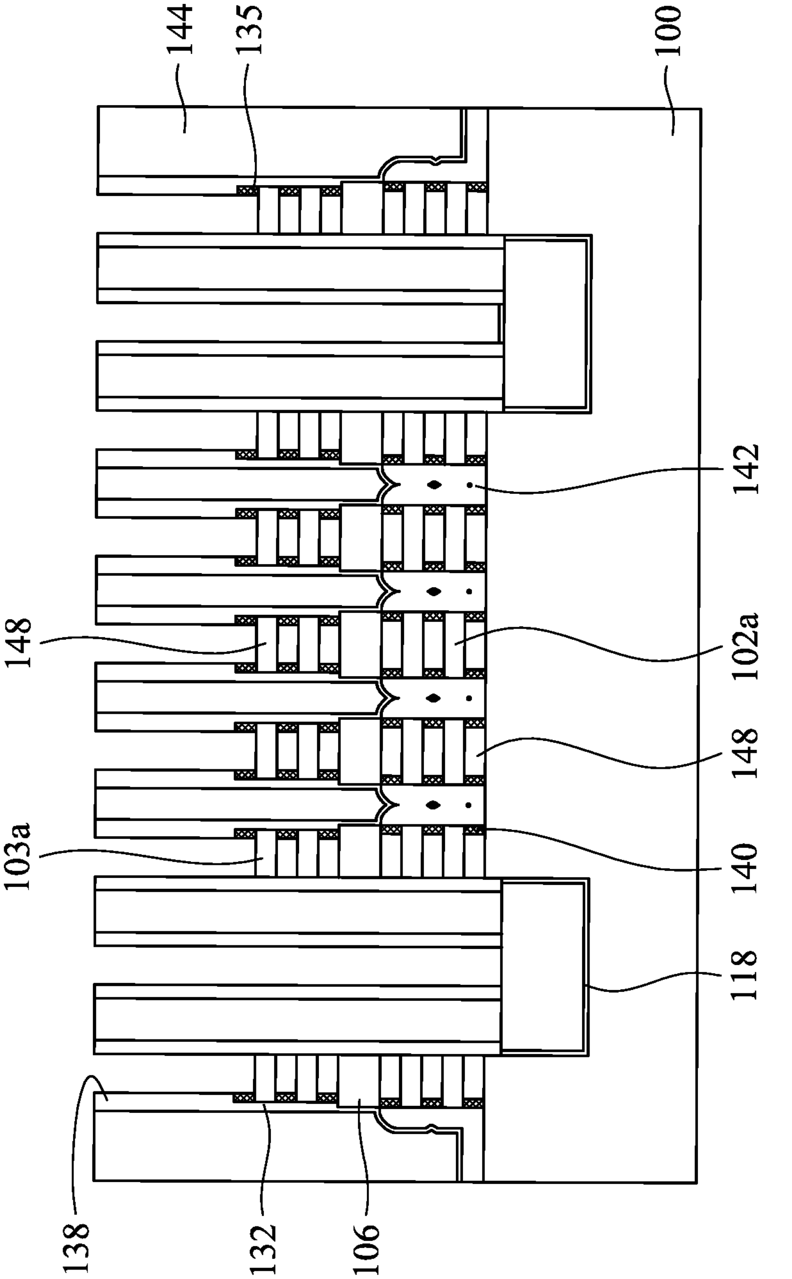
FIGS. 25A and 25B are a cross-sectional view and a perspective view of a stage of manufacturing a CFET device structure, respectively, in accordance with some embodiments.
Figure 25B:
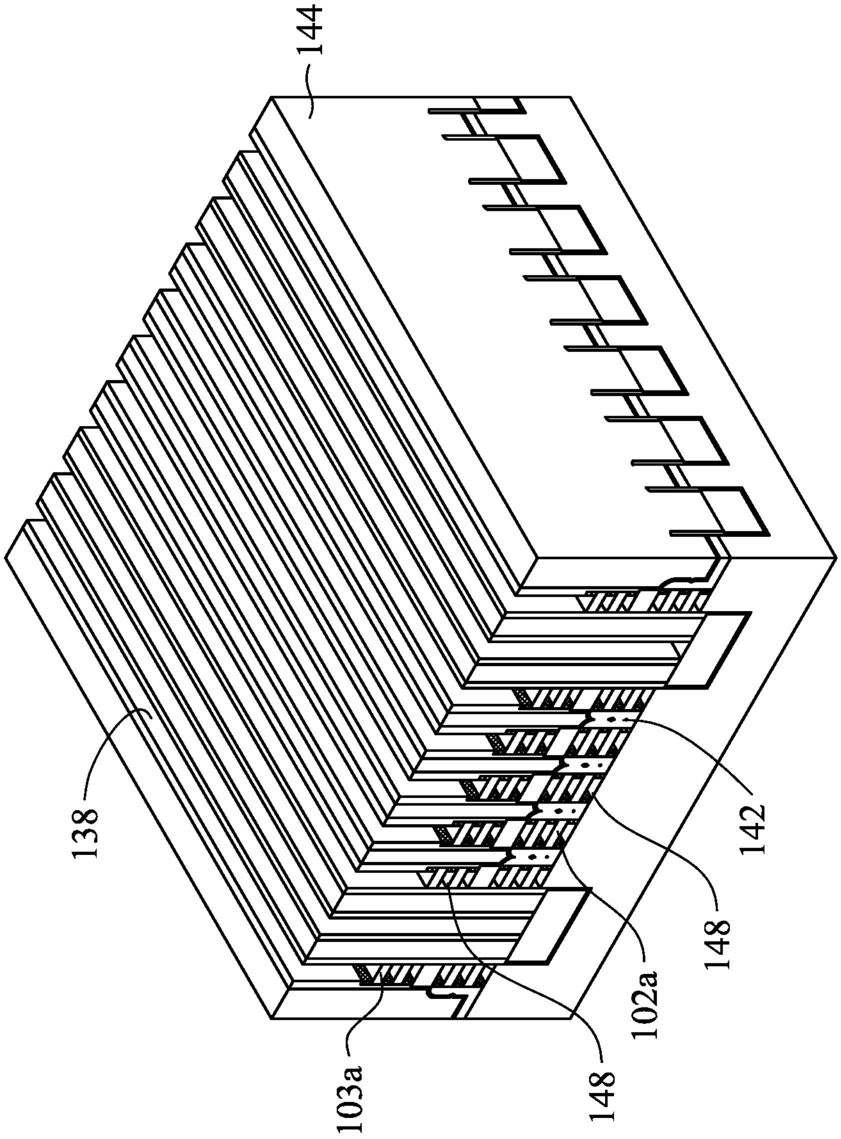

FIGS. 25A and 25B are cross-sectional view and perspective view of the nanosheet release for manufacturing the CFET, after the dummy gate layer 124 and the sacrificial gate dielectric layer 122 are removed, the second semiconductor layers 103*b* and the second semiconductor layers 102*b* are removed to expose the inner spacers 135 and 140 and the first semiconductor layers 103*a* and the first semiconductor layers 102*a*. The removal process of the second semiconductor layers 102*b* and 103*b* may be any suitable etch processes such as dry etch, wet etch, or a combination thereof. In some embodiments, the etch process may have a high selectivity of the materials of the second semiconductor layers 102*b* and 103*b* to the materials of the inner spacers 135 and 140 and the first semiconductor layers 102*a* and 103*a*. The removal of the second semiconductor layers 102*b* and 103*b* creates an opening 148 immediately above and below each of the first semiconductor layers 102*a* and 103*a*. Each of the first semiconductor layers 102*a* extending from one S/D region 142 to an adjacent S/D region 142 at the same level may be a nanosheet channel in the bottom FET, and each of the first semiconductor layers 103*a* may be a nanosheet channel in the top FET extending between each pair of S/D regions to be formed in the subsequent processes.

Figure 26A:
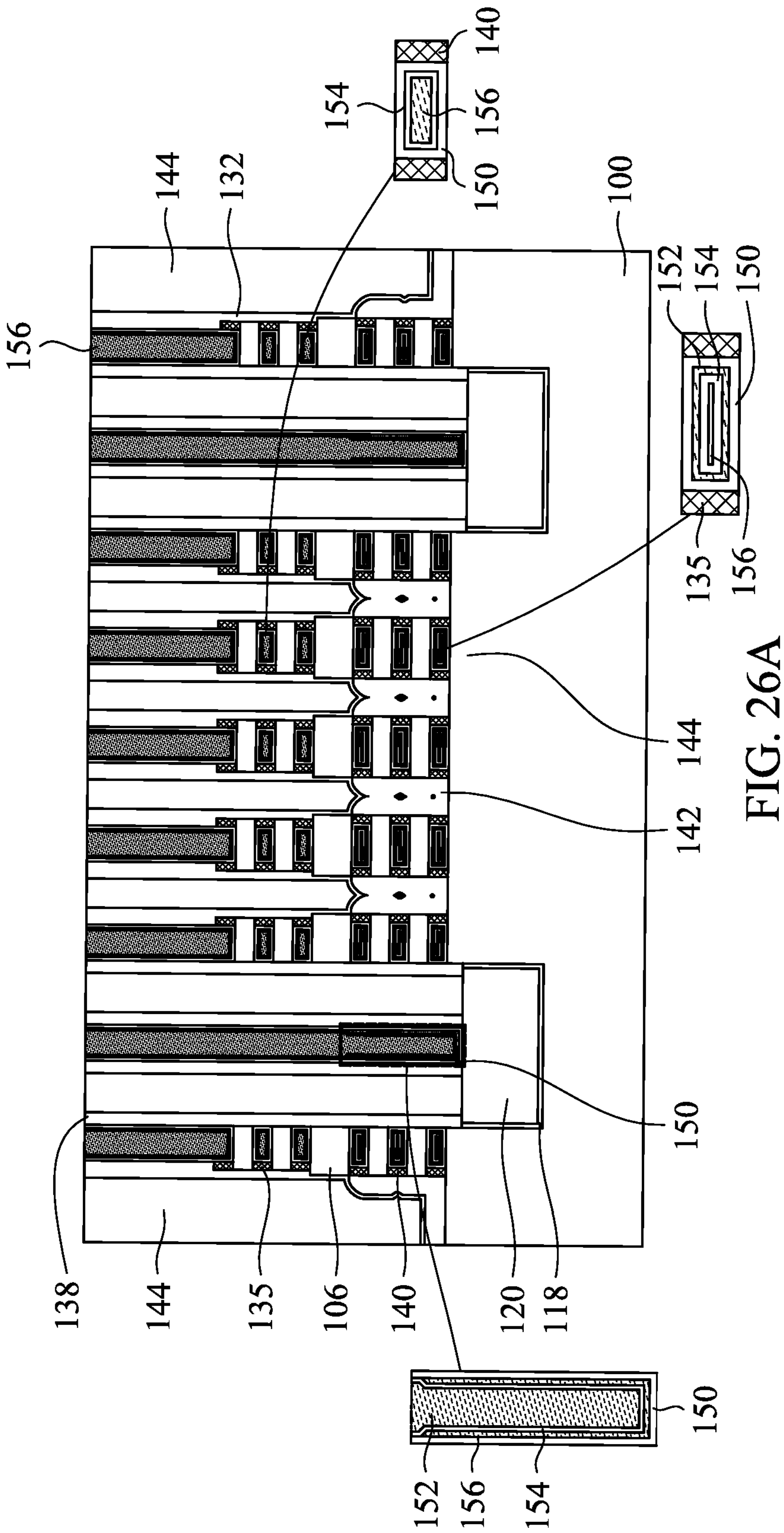
FIGS. 26A and 26B are a cross-sectional view and a perspective view of a stage of manufacturing a CFET device structure, respectively, in accordance with some embodiments.
Figure 26B:
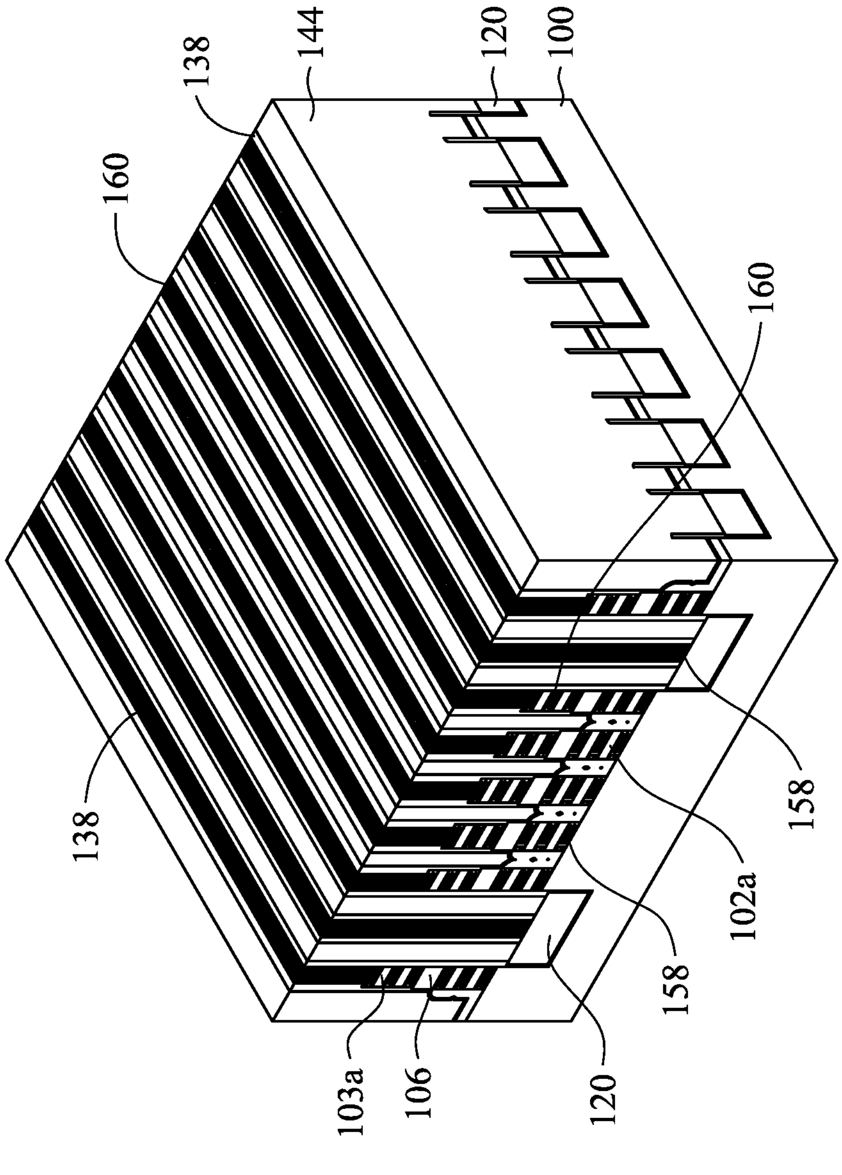

FIGS. 26A and 26B are cross-sectional view and perspective view showing the metal gate deposition process after the dummy gate layers 124 have been removed. A high-k dielectric layer 150 is conformally formed on the exposed surfaces of the CFET device, including the surfaces of the first semiconductor layers 102*a* and 103*a* exposed in the openings 148. The high-k dielectric layer 150 may include or made of oxide containing material such as hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), or other suitable high-k materials. The high-k dielectric layer 150 may be formed by a conformal deposition process such as an ALD process or a CVD process. The high-k dielectric layer 160 may have a thickness ranging from about 0.5 nm to about 3 nm.

A conformal metal layer 152 is formed on the portion of the high-k dielectric layer 150 formed around the first semiconductor layers 102*a* in the bottom FET device. As shown in FIG. 26A, the metal layer 152 is formed only in the bottom FET device below the MDI layer 106 accordance with some embodiments. The metal layer 152 may include a tungsten layer, for example. The metal layer 152 may be formed by first forming a metal layer on the high-k dielectric layer 150, followed by recessing the metal layer to remove the portion of the metal layer formed on the portion of the high-k dielectric layer 150 around the first semiconductor layers 103*a*. A conformal metal layer 154 is then formed on the metal layer 152 in the bottom FET device. The metal layer 154 is also formed on the portion of the high-k dielectric layer 150 located in the top FET devices, such as the portion of the high-k dielectric layer 150 around the first semiconductor layers 103*a* of the top FET device. The remaining opening spaces, including those within all openings 148 and the area where the dummy gate layers 124 were removed, are then filled with another metal layer 156. The metal layer 154 may be made of materials including Al, TiAl, $TiAl_x$, $TiAlC_x$, $TiC_x$, $TaC_x$, or a composite of any of these materials. The metal layer 156 may be made of materials including TiN, TaN, $TiN_x$, $TaN_x$, TiNSi, or a composite of any of these materials. The metal layers 154 and 156 may be formed by suitable deposition processes such as ALD. The metal layer 156 may include titanium-containing materials such as TiN, for example. The metal layer 156 may be the gate electrode of the top and bottom FET devices.

In some embodiments, the work function layers of the CFET device may include multiple metal layers. In the case where the CFET includes a p-type bottom FET device and a top n-type FET device, the work function layers of the bottom FET device may include an additional metal layer with respect to the gate electrodes of the top FET. For example, as shown in FIG. 26A, the top FET device includes a work function layer including the metal layer 154, while the work function layer of the bottom FET device includes the metal layer 152 in addition to the metal layer 154. The work function layer of the bottom FET device (including the metal layer 152 and the metal layer 154) is denoted with the reference numeral 158 and the work function layer of the top FET device (including the metal layer 154) is denoted with the reference numeral 160 as shown in FIG. 26B.

A planarization process, such as a CMP process, may be performed to remove the portions of the metal layers 154, 156 formed on the ILD layer 144.

Figure 27A:
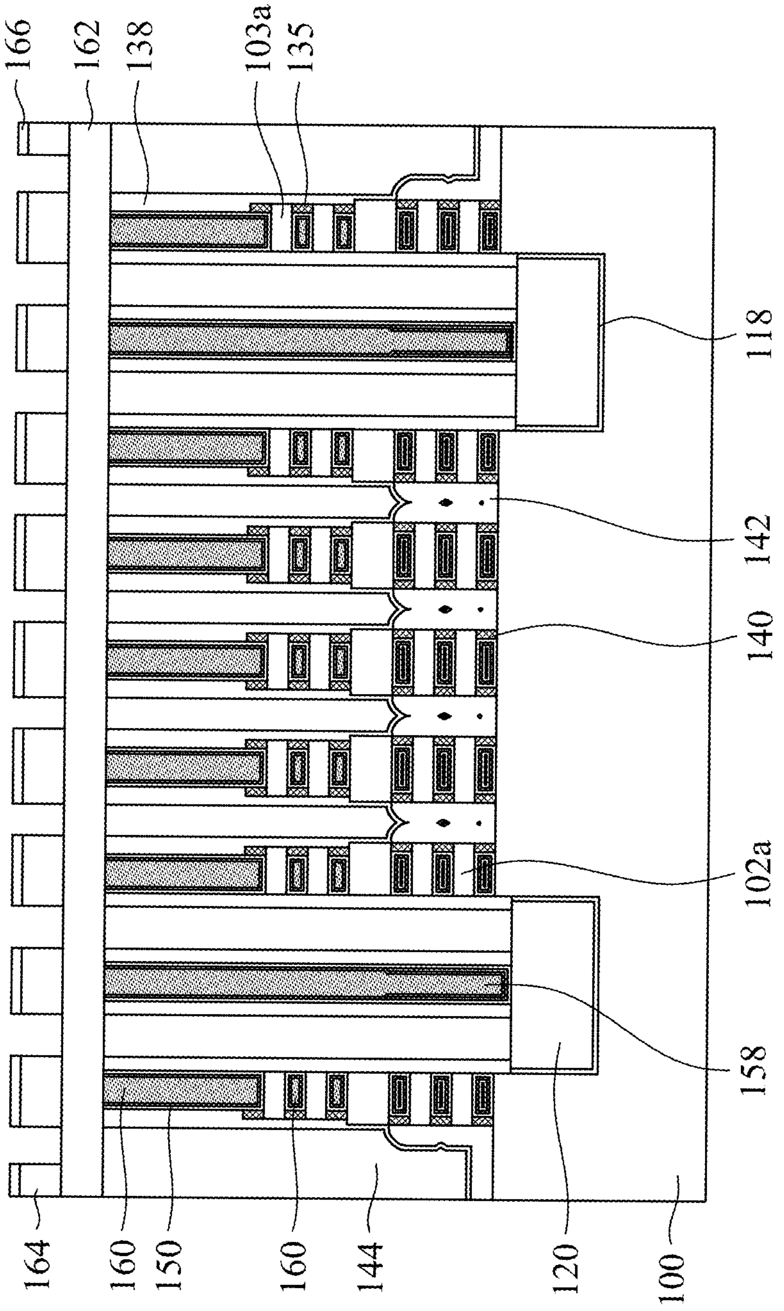
FIGS. 27A and 27B are a cross-sectional view and a perspective view of a stage of manufacturing a CFET device structure, respectively, in accordance with some embodiments.
Figure 27B:
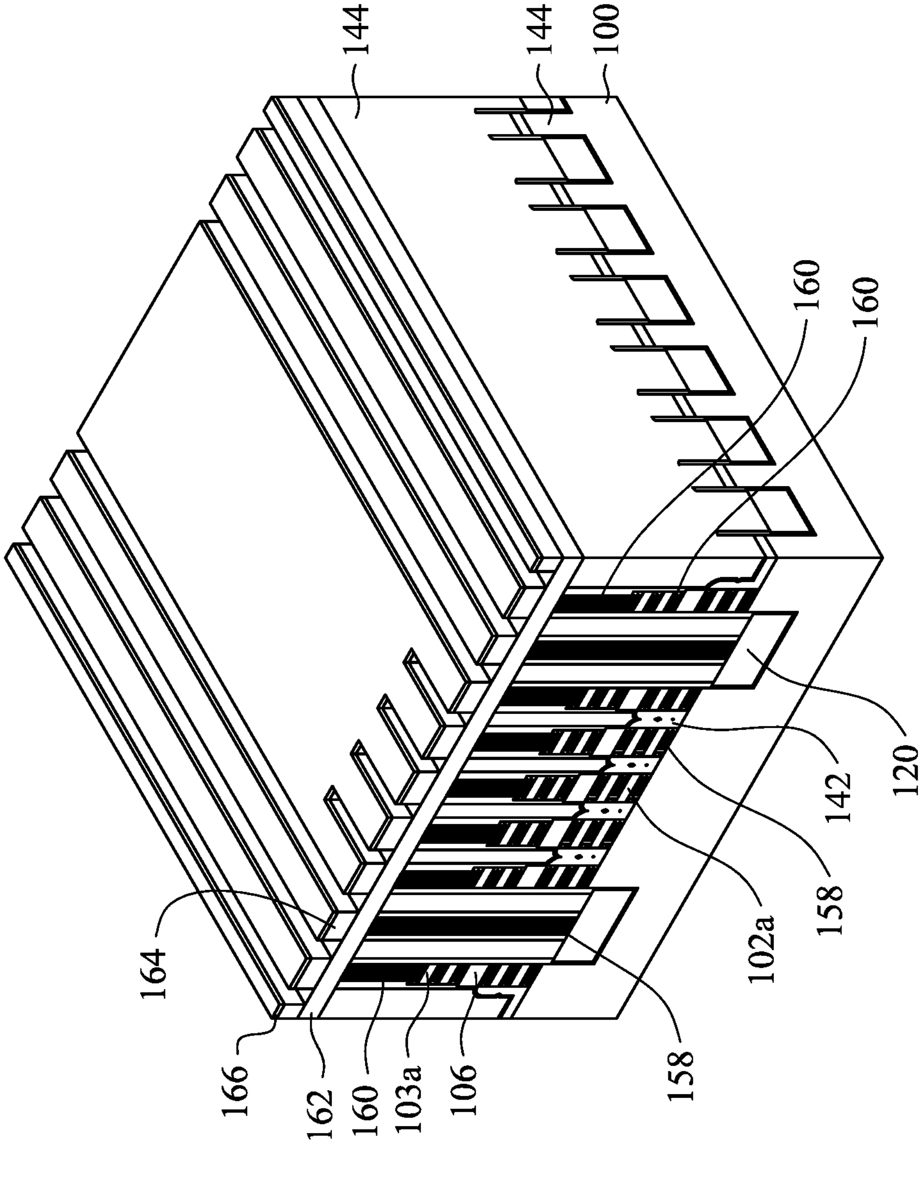

FIGS. 27A and 27B are cross-sectional views and perspective views showing the process to define the metal layer of the bottom FET device. A dielectric layer 162 is formed over the CFET device to cover the ILD layer 144, the work function layer 160, and the spacer layer 138 enclosing the work function layer 160. A metal layer 164 is formed on the dielectric layer 162, followed by formation of a resist layer 166 on the metal layer 164. In some embodiments, the dielectric layer 162 may include an oxide layer $SiO_2$ formed by PECVD, and the resist layer 166 may include an oxide layer formed by PEALD or other suitable deposition processes. The metal layer 164 be made of TiN or other suitable conductive materials. As shown in FIG. 27A, the resist layer 166 and the metal layer 164 are patterned with openings exposing portions of the dielectric layer 162 at the positions where contacts of the bottom FET device will be formed in the subsequent processes.

Figure 28:
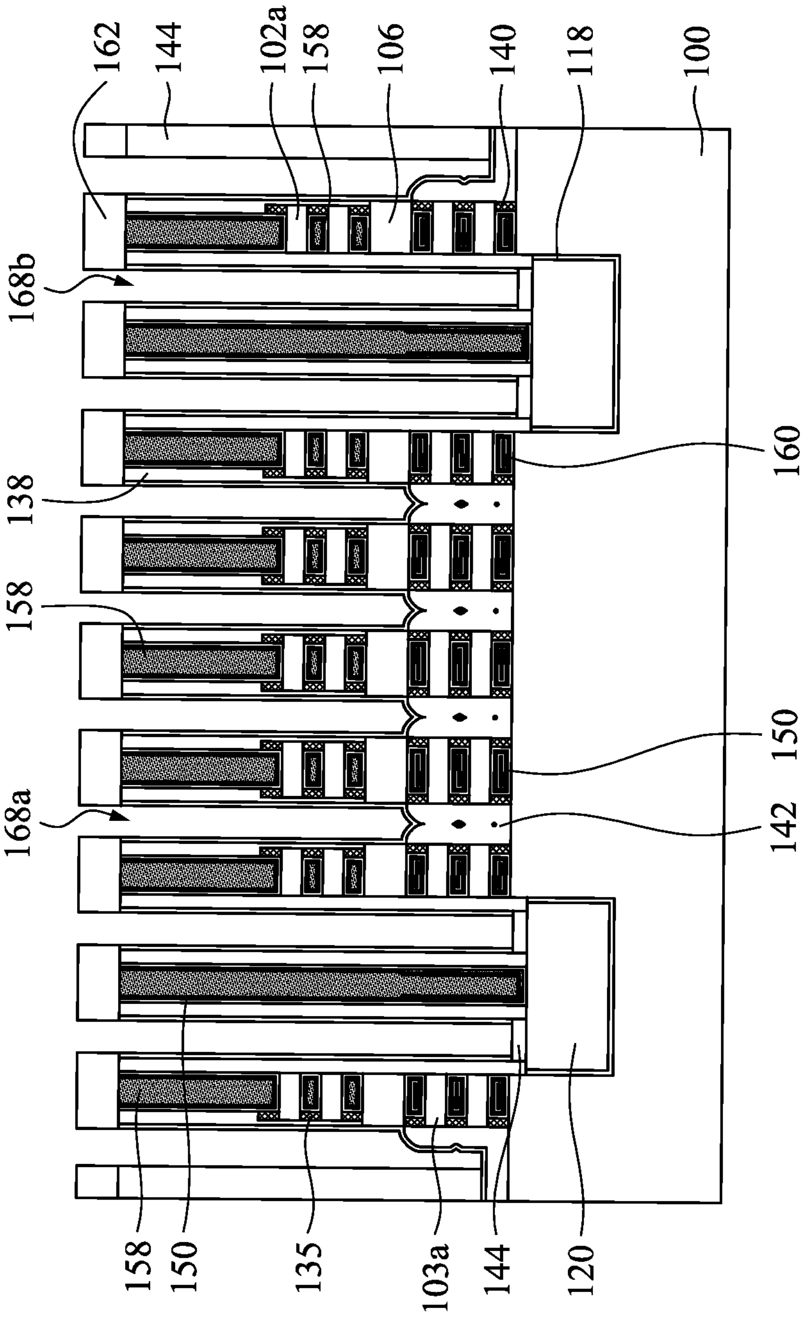
FIGS. 28-35 are cross-sectional views of various stages of manufacturing a CFET device structure in accordance with some embodiments.

The exposed dielectric layer 162 and the portions of the ILD layers 144 are etched until the remaining portion on the STI 120 reaches a predetermined thickness. As discussed above, a CSEL layer (not shown) may have been formed on the top surface of the S/D regions 142 to protect the S/D regions 142 from being etched or damaged during the etching process performed on the ILD layer 144. The patterned resist layer 166 and the metal layer 164 may be removed to expose the remaining dielectric layers 162 during the etching of the ILD layer 144, as shown in FIG. 28. The etch process performed on the ILD layers 144 creates opening 168*b* exposing the remaining ILD layer 144 over the STI 120 and the openings 168*a* exposing the S/D regions 142 of the bottom FET device. In some embodiments, the ILD layers 144 may be removed by a dry etch process with a high vertical to lateral etch ratio.

Figure 29:
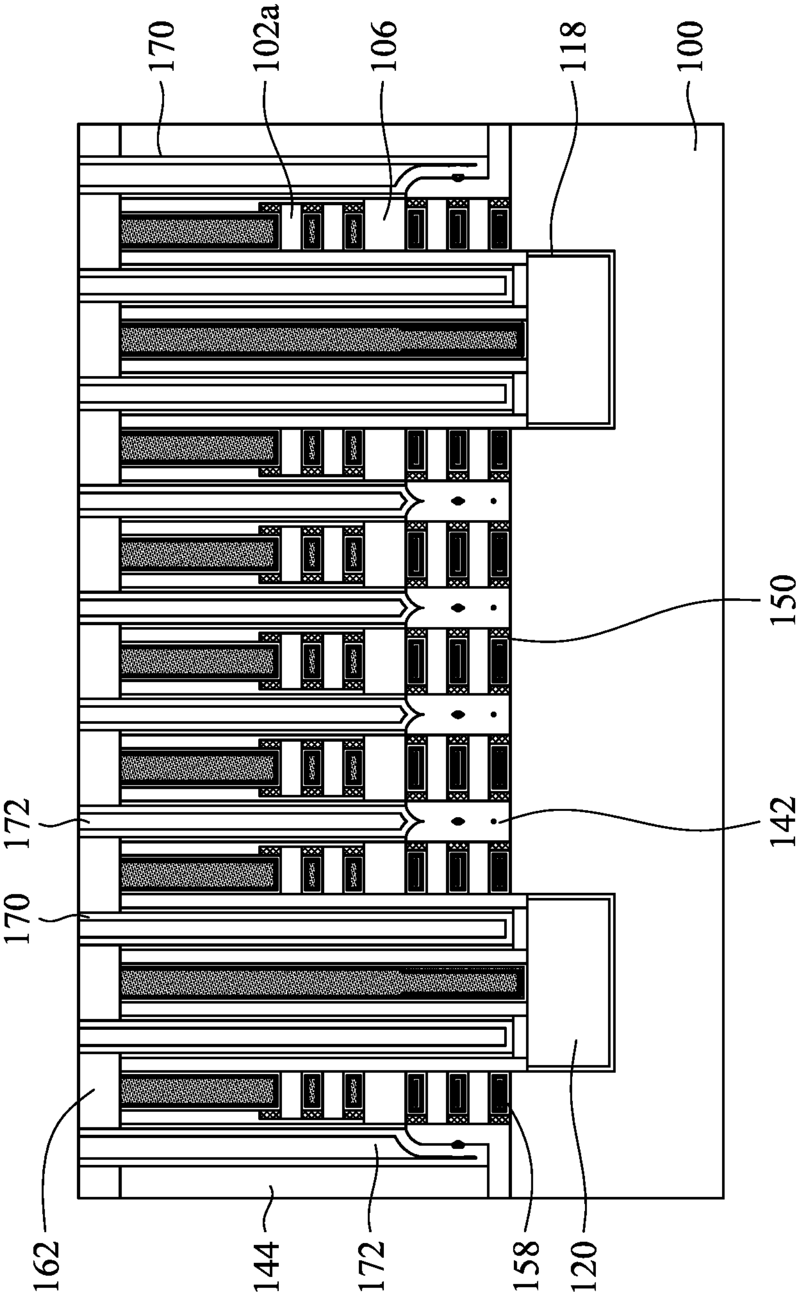

In FIG. 29, a conductive layer 170 may be formed conformally along the surfaces of the openings 168*a* and 168*b*, and then filled with a conductive layer 172. In some embodiments, the conductive layer 172 may include tungsten W, and the conductive layer 170 may include a Ti-containing layer, for example, a layer made of TiN, TaN, $TiN_x$, $TaN_x$, TiNSi, or a composite of any of these materials.

Figure 30:
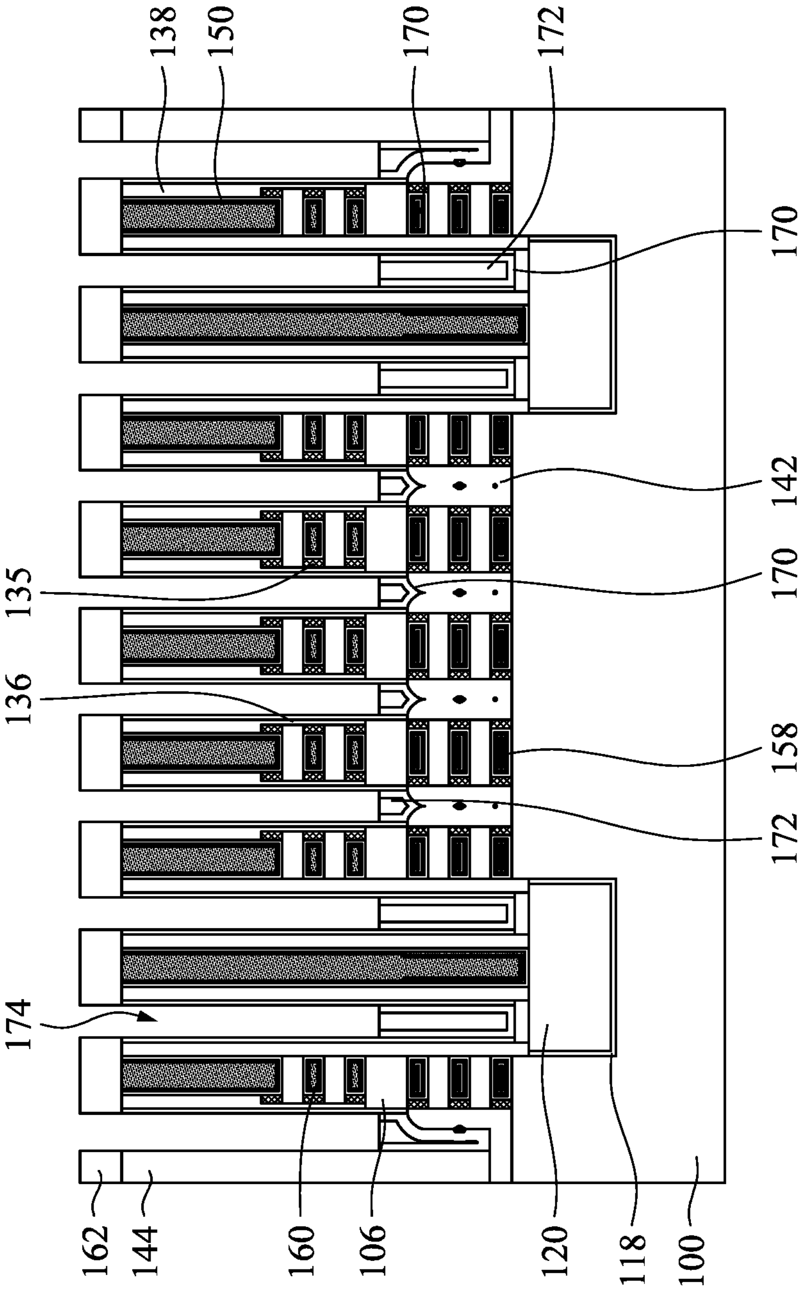

In FIG. 30, the top portion of conductive layers 170 and 172 are recessed to a level lower than the top surface of the MDI layer 106. In some embodiments, the conductive layers 170 and 172 are etched back with a top surface at a level between the top surface and the bottom surface of the MDI layer 106. Openings 174 are created to expose the inner spacer cover layers 136. The conductive contact (i.e., the conductive layers 170 and 172) of the S/D regions 142 of the bottom FET device are thus formed. In some embodiments, the conductive layer 170 is not present. A silicide layer (not shown) may be formed between the S/D region 142 and the conductive layer 170. The conductive layers 170 and 172 may be electrically connected to conductive features (not shown) disposed at the same level as the conductive layers 170 and 172 along the y-axis. In other words, the conductive layers 170 and 172 are not electrically connected to conductive features located above or below the conductive layers 170 and 172.

Figure 31:
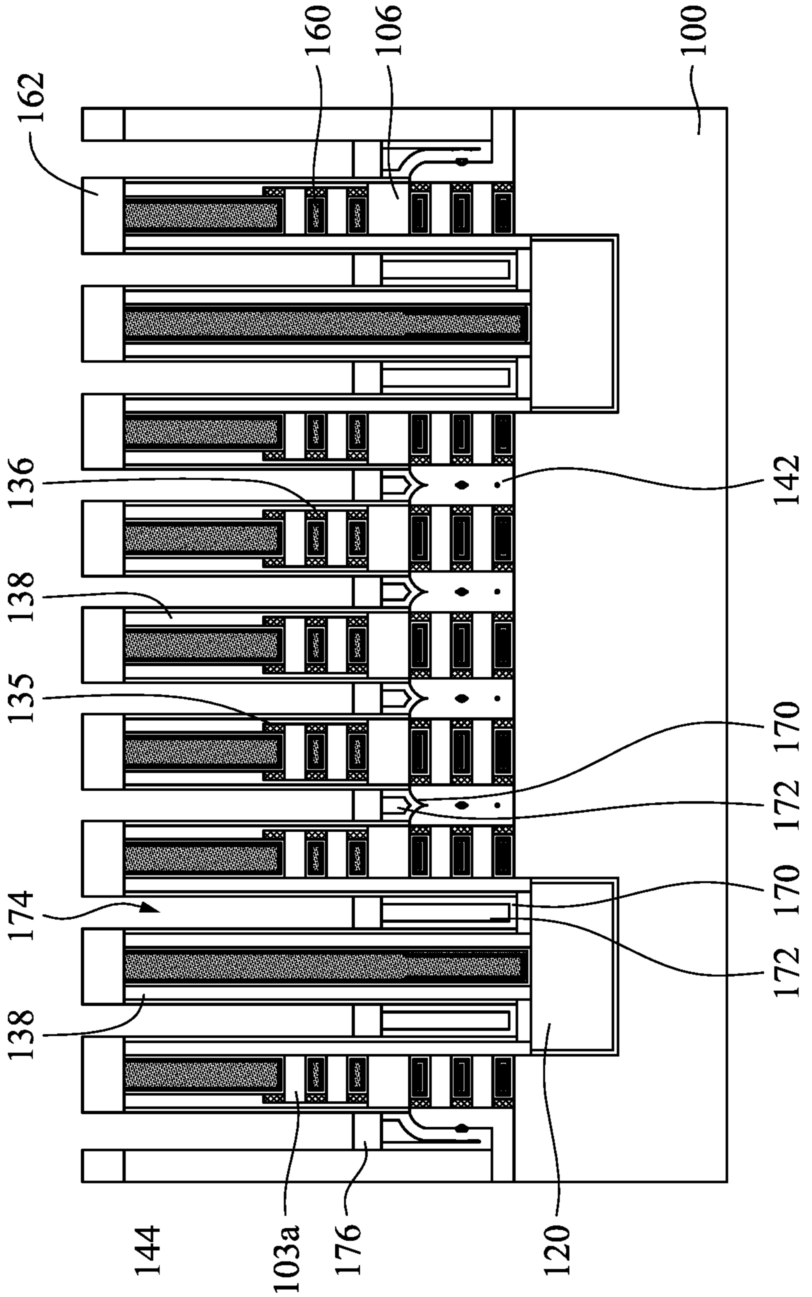

In FIG. 31, a dielectric layer 176 is formed to cover the exposed conductive layers 170 and 172. The dielectric layer 176 may have a top surface at a level below the level of the bottom surface of the bottommost first semiconductor layer 103*a*, in accordance with some embodiments. The dielectric layer 176 isolate the conductive contacts of the S/D regions 142 of the bottom FET device from the S/D regions to be formed in the top FET device. The dielectric layer 176 may include an oxide layer (SiO) formed by dielectric chemical vapor deposition (DCVD), for example.

Figure 32:
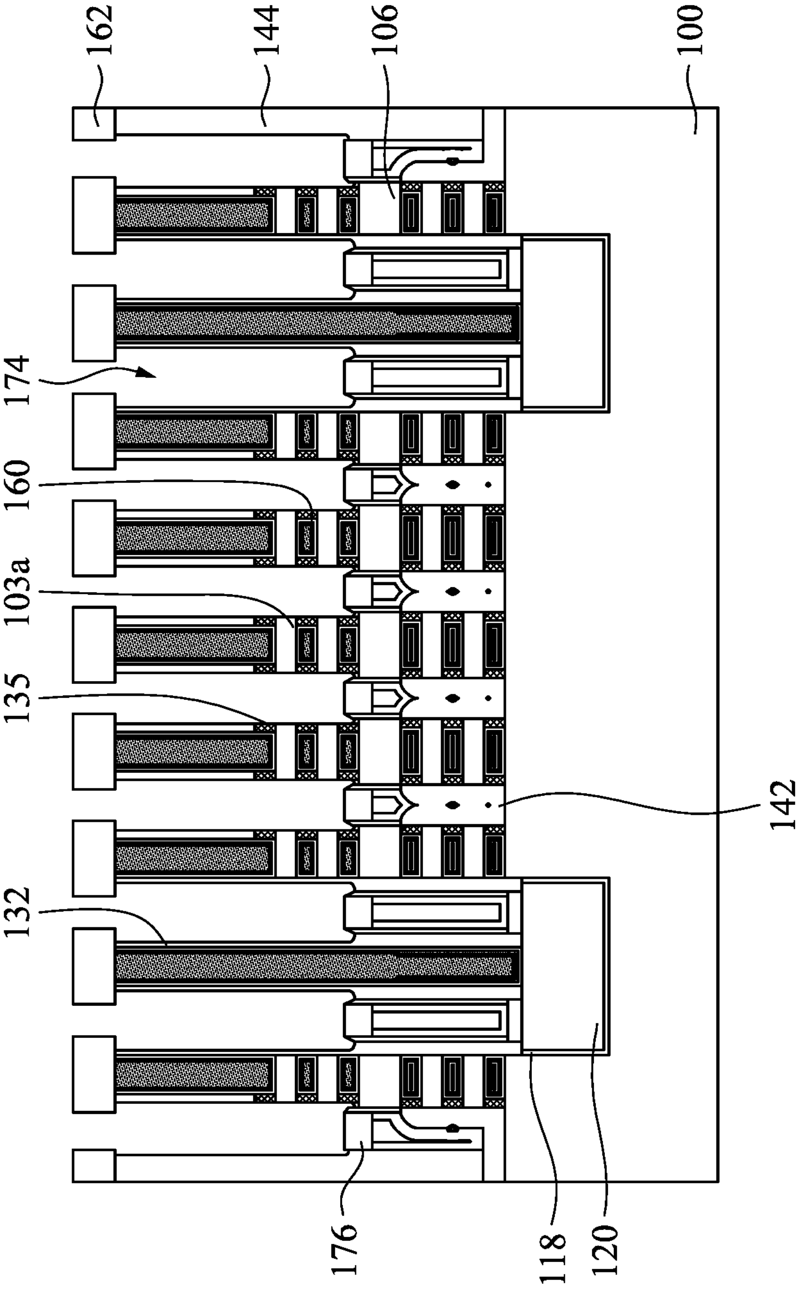

FIG. 32 shows the process to expose the first semiconductor layers 103*a* in the top FET device. The inner spacer cover layer 136 exposed within the openings 174 are removed to expose the first semiconductor layers 103*a*, the inner spacers 135, and the spacer layer 132. The step of removing the inner spacer cover layer 136 may include a dry etch process, a wet etch process, or a combination thereof. As shown in FIG. 32, the isolation layer 176 may be rounded while removing the inner spacer cover layer 136 by the etch process.

Figure 33:
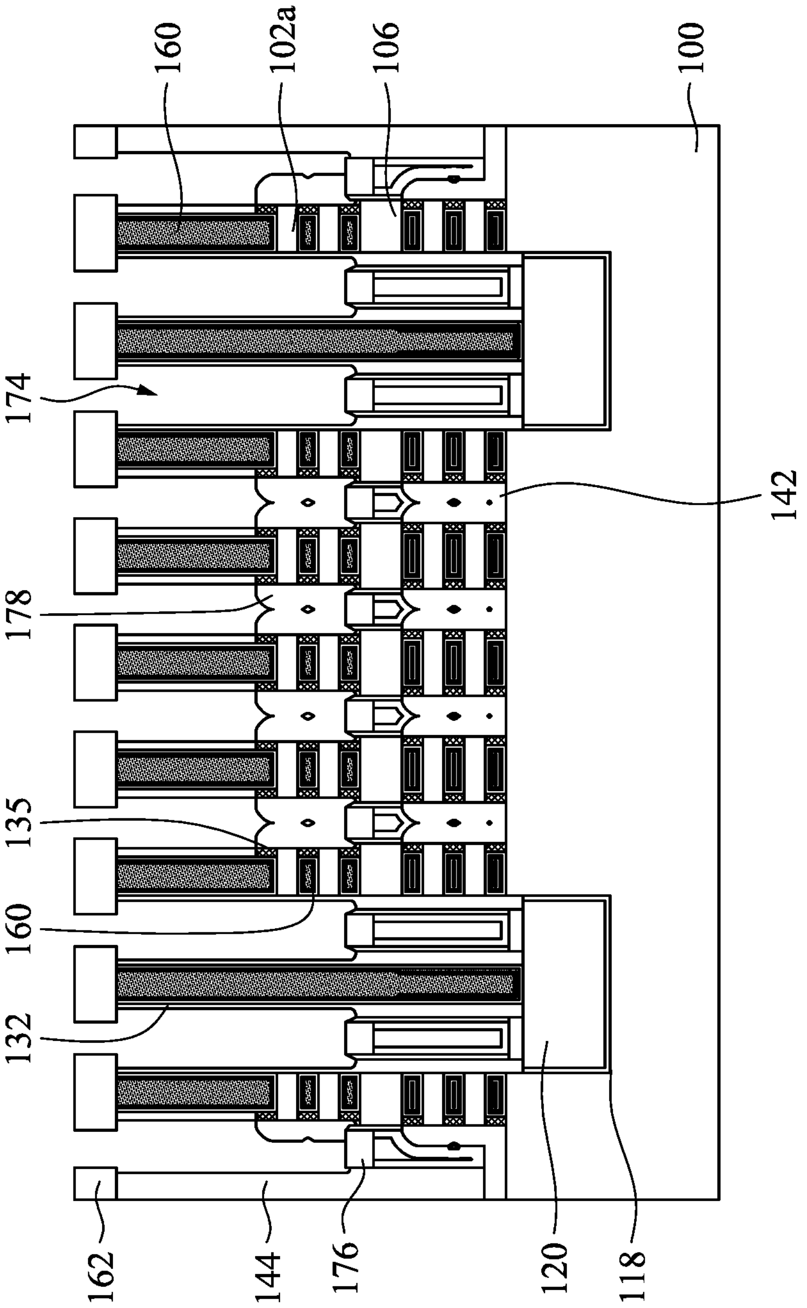

In FIG. 33, the source/drain regions 178 of the top FET device are formed over the isolation layers 176. The source/drain regions 178 of the top FET of the CFET device are epitaxially grown from the first semiconductor layers 103*a*. The epitaxially grown source/drain regions 178 may include one or more layers of Si, SiP, SiC and SiCP for n-channel FETs or Si, SiGe, Ge for p-channel FETs. For p-channel FETs, p-type dopants, such as boron (B), may also be included in the epitaxial S/D regions 178. In the embodiments as shown in FIG. 33, the epitaxial S/D regions 178 uses one or more layers of Si, SiP, and SiC, and SiCP for a n-channel FET. The epitaxial S/D regions 178 may be formed by an epitaxial growth method using CVD, ALD or MBE. The epitaxial S/D regions 178 may grow both vertically and horizontally to form facets, which may correspond to crystalline planes of the material used for the first semiconductor layers 103*a*. The epitaxial S/D regions 178 extending from the isolation layer 176 to a level near the topmost inner spacer 135 and are in contact with the inner spacers 135. In this disclosure, a source region and a drain region are interchangeably used, and the structures thereof are substantially the same. Furthermore, source/drain region (s) may refer to a source or a drain, individually or collectively dependent upon the context.

Figure 34:
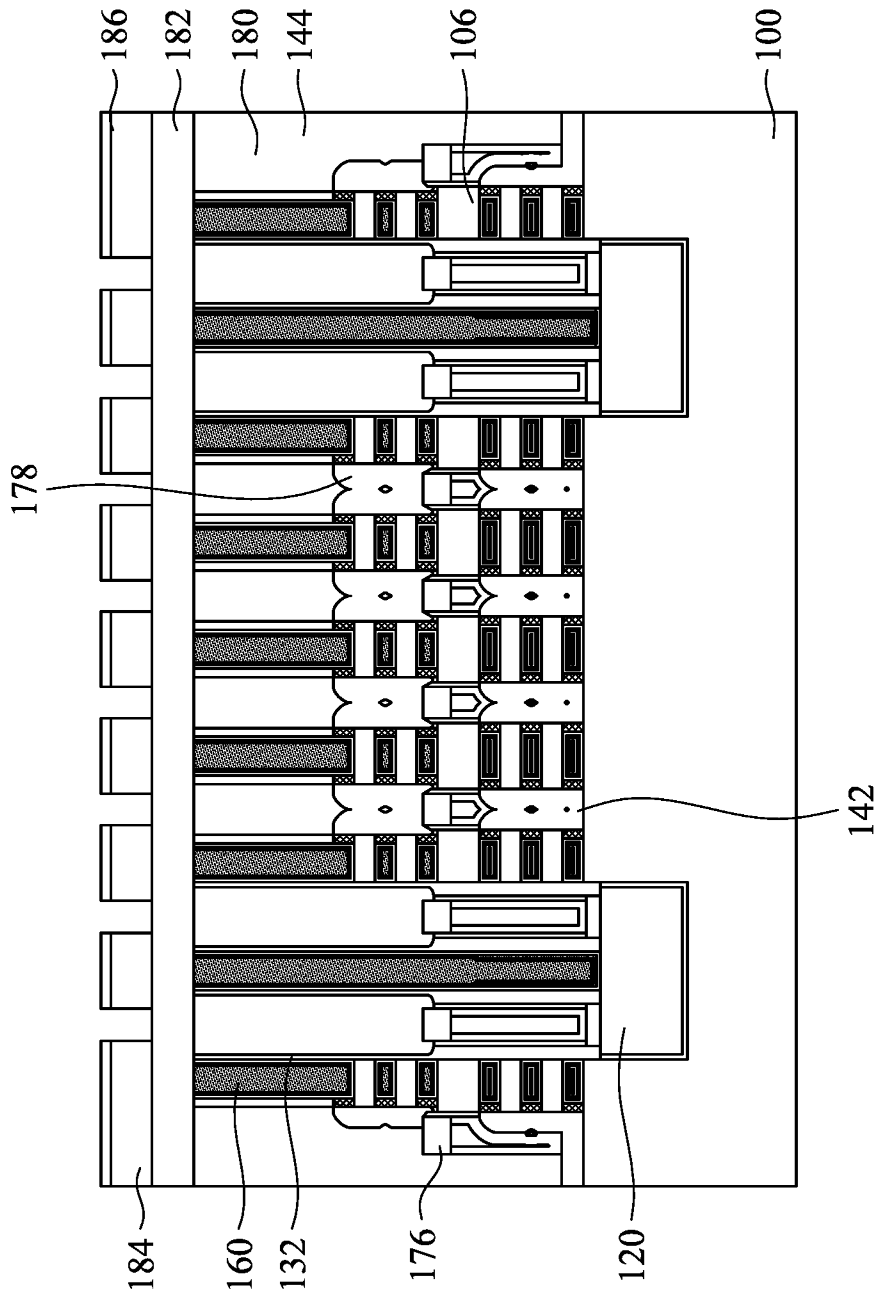
Figure 35:
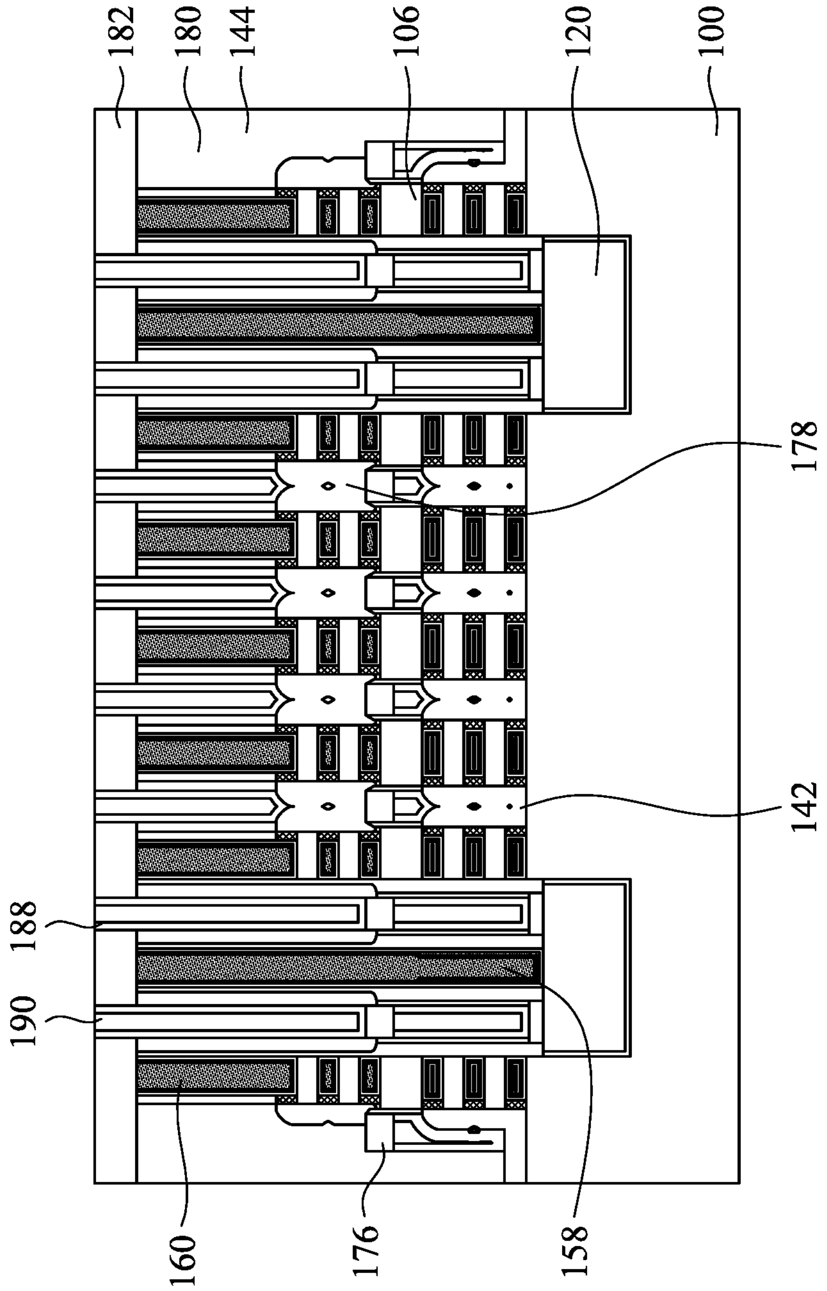

FIGS. 34 and 35 show the process for forming the first metallization (contact) layer of the top FET device in the CFET device. As shown in FIG. 34, the patterned dielectric layer 162 is removed after the S/D regions 178 of the top FET device is formed. An ILD layer 180 is formed to fill the openings 174. The ILD layer 180 may be deposited by PEALD or other suitable deposition processes. The materials for the ILD layer 180 may include the same material as the ILD layer 144 and may be formed by the same process as the ILD layer 144.

Although it is not shown in the drawings, a contact etch stop layer (CESL) may be conformally formed to cover the S/D regions 178 before forming the ILD layer 180. A dielectric layer 182 is formed over the CFET device to cover the ILD layer 180, the work function layer 160, and the spacer layer 132 around the work function layer 160. A metal layer 184 is formed on the dielectric layer 182, followed by formation of a resist layer 186 on the metal layer 184. In some embodiments, the dielectric layer 182 may include an oxide layer $SiO_2$ formed by PECVD, and the resist layer 186 may include an oxide layer formed by PEALD or other suitable deposition processes. The metal layer 184 be made of TiN or other suitable conductive materials. As shown in FIG. 34, the resist layer 186 and the metal layer 184 are patterned with openings exposing portions of the dielectric layer 182 at the positions where contacts of the top FET device will be formed in the subsequent processes.

In FIG. 35, the exposed dielectric layer 182 and the portions of the ILD layers 180 are etched until the isolation layer 176 is exposed. As discussed above, a CSEL layer (not shown) may have been formed on the top surface of the S/D regions 178 to protect the S/D regions 178 from being etched or damaged during the etching process performed on the ILD layer 180. The patterned resist layer 186 and the metal layer 184 may be removed to expose the remaining dielectric layers 182 during the etching of the ILD layer 180.

Further referring to FIG. 35, a conformal conductive layer 188 may be formed, and a conductive layer 190 may be formed on the conformal conductive layer 188. In some embodiments, the conductive layer 190 may include tungsten W, and the conductive layer 188 may include a Ti-containing layer, for example, a layer made of TiN, TaN, $TiN_x$, $TaN_x$, TiNSi, or a composite of any of these materials. The conductive contacts (i.e., the conductive layers 188 and 190) of the S/D regions 178 of the top FET device are thus formed by the metal layers 188 and 190. A silicide layer (not shown) may be formed between the S/D region 178 and the metal layer 188.

In the nanosheet FET, the dimension of the recesses of the second semiconductor layers, for example, the cavities immediately below or above the edge or peripheral portions of each of the first semiconductor layers affects the length of gates to be formed between the inner spacers. For example, in CFET device formed by the processes as shown in FIGS. 3 to 35, the lengths of the gate that includes the work function layers 158 between each pair of the inner spacers 140 and of the gate that includes the work function layers 160 between each pair of the inner spacers 135 depends on the lateral dimension of the cavities. Consequently, the dimensions of the inner spacers 135 and 140 filling the cavities have direct influence on the gate length of the p-FET and n-FET. As the cavities and the inner spacers for the p-FET and the n-FET are formed independently at different steps, the gate length of each of the FET devices can be independently tuned. In addition, the materials for each of the inner spacers 135, 140 may be the same or different from each other. The independently and separately formed inner spacers 135, 140 can thus improve the performance of the CFET device.

Figure 36:
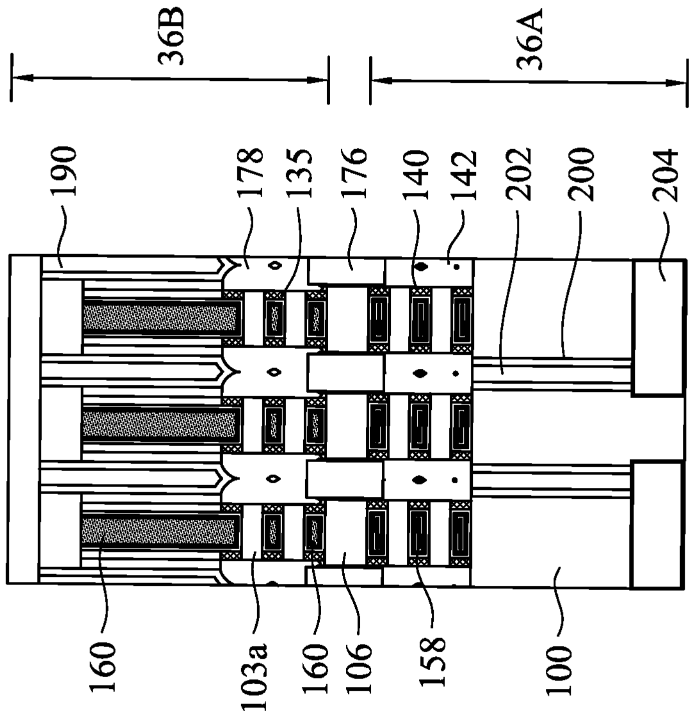
FIG. 36 shows a cross-sectional view of a CFET device in accordance with some embodiments.

FIG. 36 shows a modification of the CFET device formed by the processes as shown in FIGS. 3 to 35. The CFET device includes a first FET device 36A and a second FET 36B stacked on the first FET device 36A. In the embodiment, after the work function layers 158 are formed as shown in FIG. 26B, the steps as shown in FIGS. 27A to 30 are skipped. After the S/D regions 178 and the conductive contacts of the top FET device 36B are formed, the conductive layers, including the conductive layers 200 and 202 are formed to extend from the S/D regions 142 of the bottom FET 36A through the substrate 100 to connect with a pad 204 formed on a bottom surface of the substrate 100. The structure as shown in FIG. 36 provides a backside power delivery network (BSPDN). Although FIG. 36 only shows a single conductive layer, it is appreciated that more than one conductive layers with multiple vias may be formed in the BSPDN in accordance with some embodiments. In some embodiments, the bottom conductive layers 200 and 202 may also be formed before the dummy gate layers 124 were removed.

According to one embodiment, a method of forming a semiconductor structure is provided. The method includes forming a complementary FET (CFET) device. The CFET device including a first FET device and a second FET device isolated from each other by a middle dielectric layer and stacked over each other in a vertical direction. A first inner spacer is formed immediately below and above a peripheral portion of each of a plurality of first nanosheet channels of the first FET device. A second inner spacer is formed immediately below and above a peripheral portion of each of a plurality of second nanosheet channels of the second FET device. The first inner spacers and the second inner spacers are formed at different process steps.

In one embodiment, contacts for the first source/drain regions may be formed from a backside of the substrate. The first inner spacers may be made with dimensions different from dimensions of the second inner spacers. The first inner spacers and the second inner spacers are made of different materials according to some embodiments. The first nanosheet channels and the second nanosheet channels may be p-type FET and n-type FET, respectively.

A method for forming a CFET structure is provided in accordance with some embodiments. The method includes providing a semiconductor structure. The semiconductor structure includes a first stack of semiconductor layers including a plurality of first type semiconductor layers and a plurality of second semiconductor layers alternately stacked with each other and a second stack of semiconductor layers including a plurality of first type semiconductor layers and a plurality of second semiconductor layers alternately stacked with each other. The second stack may be arranged on top of the first stack in a vertical direction. The semiconductor structure may further include a middle dielectric layer arranged between the first stack and the second stack.

The method may further includes forming a cavity at an edge of each of first type semiconductor layers of the second stack and filling the cavity with a second inner spacer and forming a cavity at an edge of each of the first type semiconductor layers of the first stack and filling the cavity with a first inner spacer after forming the second inner spacers. According to some embodiments, the first stack of semiconductor layers may be on a first substrate, and a first dielectric layer may be formed on the first stack of semiconductor layers. The second stack of semiconductor layers may be formed on a second substrate, and a second dielectric layer may be formed on the second stack of semiconductor layers. The first stack of semiconductor layers may be transferred to the second stack of semiconductor layers by flipping the second substrate to bond the first dielectric layer and the second dielectric layer into the middle dielectric layer.

In some embodiments, a smart-cut process is performed to remove the second substrate from the first substrate. A first source/drain regions between each pair of the first inner spacers is formed. Metal contacts of the first source/drain regions and a first metallization layer for the first stack of semiconductor layers are formed. A second/drain regions between each pair of the second inner spacers is formed after forming the metal contacts and first metallization of the first stack of semiconductor layers. Metal contacts of the second source/drain regions and first metallization layer of the second stack of semiconductor layers are formed.

In some embodiments, a first source/drain regions is between each pair of the first inner spacers; and a second/drain regions is formed between each pair of the second inner spacers after forming the first source/drain regions. Metal contacts of the second source/drain regions and first metallization layer of the second stack of semiconductor layers may be formed from a frontside of the substrate. Metal contacts of the first source/drain regions and first metallization layer of the first stack of semiconductor layers may be formed from a backside of the substrate. The first inner spacers may be formed with materials different from materials used for forming the second inner spacers. In another embodiment, the first inner spacers may be formed with dimensions different dimensions of the second spacers. The first stack of semiconductor layers may be p-type and the second stack of semiconductor layers may be n-type semiconductor layers.

A semiconductor structure is provided according to some embodiments. The semiconductor structure may include a first FET device formed on a substrate, a second FET device stacked over the first FET device in a vertical direction, a middle dielectric layer stacked between the first FET device and the second FET device, a plurality of first inner spacers of the first FET device, and a plurality of second inner spacers of the second FET device. The first inner spacers and the second inner spacers are formed independently from each other. The first inner spacers may include materials different from materials of the second inner spacers. The first inner spacers may have dimensions different from dimensions of the second inner spacers. The first FET device has a conductive type different from a conductive type of the second FET device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of forming a semiconductor structure, comprising:

forming a complementary FET (CFET) device, the CFET device including a first FET device and a second FET device isolated from each other by a middle dielectric layer and stacked over each other in a vertical direction, comprising:

forming a first inner spacer immediately below and above a peripheral portion of each of a plurality of first nanosheet channels of the first FET device;

forming a second inner spacer immediately below and above a peripheral portion of each of a plurality of second nanosheet channels of the second FET device, wherein the first inner spacers and the second inner spacers are formed at different process steps, and the first inner spacers and the second inner spacers comprise different materials;

forming first source/drain regions interfacing the plurality of first nanosheet channels and forming second source/drain regions interfacing the plurality of second nanosheet channels; and forming first conductive contacts electrically connected to corresponding first source/drain regions before forming the second source/drain regions, wherein the first conductive contacts are disposed between the first source/drain regions and the second source/drain regions.

2. The method of claim 1, further comprising forming each of the first FET device and the second FET device with a gate-all-around structure.

3. The method of claim 1, wherein the first inner spacers are made with dimensions different from dimensions of the second inner spacers.

4. The method of claim 1, wherein the first FET device includes a first conductive type FET, and the second FET device includes a second conductive type FET different from the first conductive type FET.

5. The method of claim 1, further comprising forming a first dummy gate layer and a second dummy gate layer, wherein the plurality of first nanosheet channels and the plurality of second nanosheet channels are located between the first and second dummy gate layers.

6. The method of claim 5, wherein the first and second dummy gate layers are formed on and interfacing a shallow trench isolation (STI).

7. The method of claim 5, further comprising:

removing the first and second dummy gate layers to form first and second openings; and depositing a metal layer in the first and second openings, wherein the metal layer comprises a bottom portion and a top portion, and a number of layers adjacent the bottom portion of the metal layer is different from a number of layers adjacent the top portion of the metal layer.

8. A method for forming a CFET structure, comprising:

providing a semiconductor structure including:

a first stack of semiconductor layers including a plurality of first semiconductor layers and a plurality of second semiconductor layers alternately stacked with each other;

a second stack of semiconductor layers including a plurality of third semiconductor layers and a plurality of fourth semiconductor layers alternately stacked with each other, wherein the second stack is arranged on top of the first stack in a vertical direction; and a middle dielectric layer arranged between the first stack and the second stack;

forming a first cavity at an edge of each of the plurality of third semiconductor layers of the second stack, and filling the cavity with a first inner spacer;

forming a second cavity at an edge of each of the plurality of first semiconductor layers of the first stack, and filling the second cavity with a second inner spacer after forming the first inner spacers, wherein the first inner spacers and the second inner spacers comprise different materials;

forming first source/drain regions electrically connected to the plurality of second semiconductor layers;

forming first conductive layers over the first source/drain regions;

forming second source/drain regions electrically connected to the plurality of fourth semiconductor layers after forming the first conductive layers; and forming second conductive layers over the second source/drain regions.

9. The method of claim 8, further comprising:

forming the first stack of semiconductor layers on a first substrate;

forming a first dielectric layer on the first stack of semiconductor layers;

forming the second stack of semiconductor layers on a second substrate;

forming a second dielectric layer on the second stack of semiconductor layers; and transferring the first stack of semiconductor layers to the second stack of semiconductor layers by flipping the second substrate to bond the first dielectric layer and the second dielectric layer into the middle dielectric layer.

10. The method of claim 9, further comprising performing a smart-cut process to remove the second substrate from the first substrate.

11. The method of claim 8, further comprising forming the first inner spacers with dimensions different dimensions of the second inner spacers.

12. A semiconductor structure, comprising:

a first FET device comprising a first source/drain region and a first gate electrode;

a second FET device disposed over the first FET device in a vertical direction, wherein the second FET device comprises a second source/drain region;

a conductive contact disposed between the first and second source/drain regions;

a middle dielectric layer disposed between the first FET device and the second FET device, wherein the conductive contact is disposed adjacent the middle dielectric layer, and the first electrode is disposed below the middle dielectric layer;

a plurality of first inner spacers of the first FET device; and a plurality of second inner spacers of the second FET device, wherein the first inner spacers and the second inner spacers are formed independently from each other, and the first inner spacers and the second inner spacers comprise different materials.

13. The semiconductor structure of claim 12, wherein the first inner spacers have dimensions different from dimensions of the second inner spacers.

14. The semiconductor structure of claim 12, wherein the first FET device has a conductive type different from a conductive type of the second FET device.

15. The semiconductor structure of claim 12, wherein one of the second inner spacers includes a first outer surface, one of the first inner spacers includes a second outer surface, wherein the first and second outer surfaces are misaligned.

16. The semiconductor structure of claim 12, wherein the second FET device further comprises a second gate electrode disposed over the middle dielectric layer.

17. The semiconductor structure of claim 16, wherein the first FET device further comprises a first plurality of semiconductor layers, wherein the first gate electrode is disposed around the first plurality of semiconductor layers.

18. The semiconductor structure of claim 17, wherein the second FET device further comprises a second plurality of semiconductor layers, wherein the second gate electrode is disposed around the second plurality of semiconductor layers.

19. The semiconductor structure of claim 12, wherein the conductive contact comprises a first conductive layer and a second conductive layer.

20. The semiconductor structure of claim 19, wherein the first and second conductive layers comprise different materials.

* * * * *